United States Patent
Chiang et al.

(10) Patent No.: US 11,380,369 B2
(45) Date of Patent: Jul. 5, 2022

(54) SEMICONDUCTOR DEVICE INCLUDING MEMORY CELLS AND METHOD FOR MANUFACTURING THEREOF

(71) Applicant: TAIWAN SEMICONDUCTOR MANUFACTURING CO., LTD., Hsinchu (TW)

(72) Inventors: Hung-Li Chiang, Taipei (TW); Yu-Sheng Chen, Hsinchu (TW); Chao-Ching Cheng, Hsinchu (TW); Tzu-Chiang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 97 days.

(21) Appl. No.: 16/427,292

(22) Filed: May 30, 2019

(65) Prior Publication Data

US 2020/0176032 A1  Jun. 4, 2020

Related U.S. Application Data

(60) Provisional application No. 62/774,144, filed on Nov. 30, 2018.

(51) Int. Cl.
*H01L 27/11592* (2017.01)
*G11C 5/06* (2006.01)
(Continued)

(52) U.S. Cl.
CPC .......... *G11C 5/063* (2013.01); *G11C 11/161* (2013.01); *G11C 11/223* (2013.01);
(Continued)

(58) Field of Classification Search
CPC ......... H01L 27/11512; H01L 27/11514; H01L 27/1159; H01L 27/11592; H01L 27/11597; H01L 27/222; H01L 27/228; H01L 27/2409; H01L 27/2427; H01L 27/2436; H01L 27/2481; H01L 43/08; H01L 43/10; H01L 43/12; H01L 45/04; H01L 45/06; H01L 45/1206; H01L 45/124;
(Continued)

(56) References Cited

U.S. PATENT DOCUMENTS 8,390,046 B2  3/2013  Kawahara et al.
9,431,603 B1  8/2016  Hsieh et al.
(Continued)

FOREIGN PATENT DOCUMENTS

GN  103168359 A  6/2013
KR  100684875 B1  2/2007
(Continued)

*Primary Examiner* — Matthew C Landau
*Assistant Examiner* — Dmitriy Yemelyanov
(74) *Attorney, Agent, or Firm* — McDermott Will & Emery LLP

(57) ABSTRACT

A semiconductor device includes logic circuitry including a transistor disposed over a substrate, multiple layers each including metal wiring layers and an interlayer dielectric layer, respectively, disposed over the logic circuitry, and memory arrays. The multiple layers of metal wiring include, in order closer to the substrate, first, second, third and fourth layers, and the memory arrays include lower multiple layers disposed in the third layer.

20 Claims, 23 Drawing Sheets

(51) Int. Cl.
*H01L 27/1159* (2017.01)
*G11C 11/22* (2006.01)
*H01L 45/00* (2006.01)
*H01L 43/08* (2006.01)
*H01L 43/10* (2006.01)
*H01L 43/12* (2006.01)
*H01L 27/24* (2006.01)
*H01L 27/22* (2006.01)
*H01L 27/11597* (2017.01)
*G11C 11/16* (2006.01)

(52) U.S. Cl.
CPC .............. *H01L 27/1159* (2013.01); *H01L 27/11592* (2013.01); *H01L 27/11597* (2013.01); *H01L 27/228* (2013.01); *H01L 27/2436* (2013.01); *H01L 27/2481* (2013.01); *H01L 43/08* (2013.01); *H01L 43/10* (2013.01); *H01L 43/12* (2013.01); *H01L 45/06* (2013.01); *H01L 45/1206* (2013.01); *H01L 45/141* (2013.01); *H01L 45/146* (2013.01); *H01L 45/1675* (2013.01)

(58) Field of Classification Search
CPC ............ H01L 45/141; H01L 45/143; H01L 45/144; H01L 45/146; H01L 45/148; H01L 45/16; H01L 45/1675
See application file for complete search history.

(56) References Cited

U.S. PATENT DOCUMENTS

| | | | |
|---|---|---|---|
| 2006/0197115 A1* | 9/2006 | Toda | G11C 7/18 257/248 |
| 2013/0112935 A1* | 5/2013 | Himeno | H01L 45/16 257/4 |
| 2014/0077149 A1 | 3/2014 | Chen et al. | |
| 2015/0144859 A1* | 5/2015 | Chen | H01L 45/12 257/4 |
| 2017/0053967 A1 | 2/2017 | Chuang et al. | |
| 2017/0117467 A1* | 4/2017 | Chang | H01L 45/16 |
| 2018/0012934 A1 | 1/2018 | Bateman | |
| 2018/0012937 A1 | 1/2018 | Park et al. | |
| 2018/0033826 A1 | 2/2018 | Choi et al. | |
| 2018/0159030 A1 | 6/2018 | Park | |
| 2018/0182810 A1 | 6/2018 | Yi et al. | |
| 2018/0205002 A1 | 7/2018 | Bak | |
| 2018/0277517 A1 | 9/2018 | Kim et al. | |
| 2018/0342268 A1 | 11/2018 | Siau et al. | |

FOREIGN PATENT DOCUMENTS

| | | |
|---|---|---|
| KR | 10-2010-0094905 A | 8/2010 |
| KR | 10-1022580 B1 | 3/2011 |
| KR | 20160034519 A | 3/2016 |
| KR | 20160123081 A | 10/2016 |
| TW | 201511237 A | 3/2015 |
| TW | 201834203 A | 9/2018 |

* cited by examiner

US 11,380,369 B2

SEMICONDUCTOR DEVICE INCLUDING MEMORY CELLS AND METHOD FOR MANUFACTURING THEREOF

RELATED APPLICATION

This application claims priority to U.S. Provisional Patent Application No. 62/774,144 filed Nov. 30, 2018, the entire contents of which are incorporated herein by reference.

BACKGROUND

Logic semiconductor devices including memory cells have been investigated and desired. In particular, integration of the memory cells in metal wiring layers are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
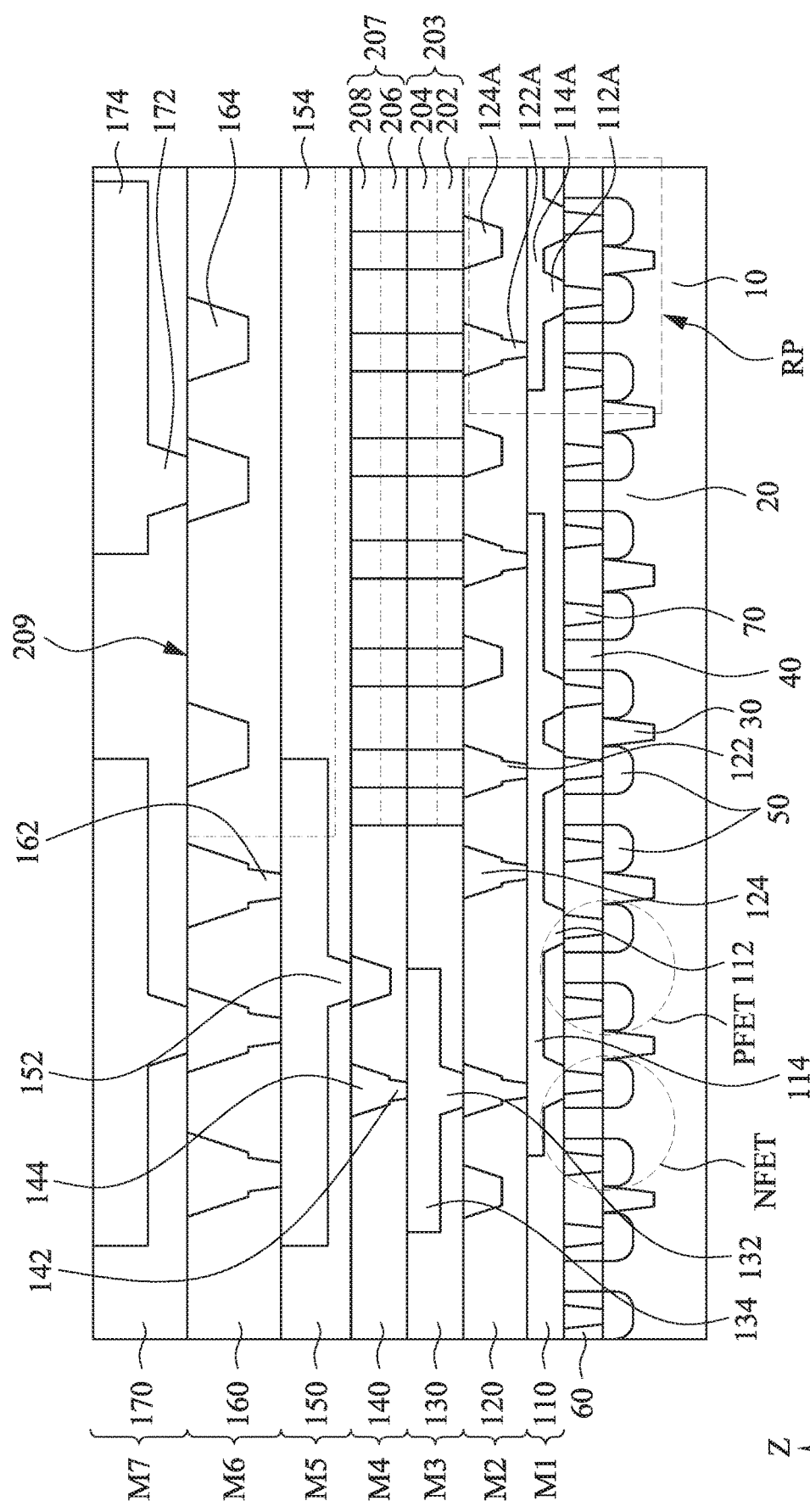
FIG. 1A shows a cross sectional view of a semiconductor integrated circuit (IC) including logic circuit and memory cells according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is directed to a semiconductor logic circuit device with high-density embedded memory arrays. The memory arrays include memory cells. The memory cells include at least one of a resistive random access memory (RRAM) call, a phase change RAM (PCRAM) cell, a ferroelectric RAM (FRAM) cell, a magnetic RAM (MRAM) cell, a nanotube RAM (NRAM) cell, and any type of memory compatible with nano-scale logic circuits. In some embodiments, the nano-scale logic circuit has a gate pitch less than about 100 nm. The memory array for this architecture includes stacked metal layers, a selector layer, and a memory layer providing different states. The memory array includes bit lines and word lines, and the memory further includes peripheral circuits, such as word line drivers, bit line drivers, and decoders. In the present disclosure, the memory arrays are located in relatively lower level wiring layers (e.g., third and/or fourth wiring layers), and a part of the region below the memory arrays is utilized for a peripheral circuit of the memory array as well as a logic circuit, an I/O (input/output) circuit, an ESD (electrostatic discharge) circuit, and any other circuitry.

FIG. 1A shows a cross sectional view of a semiconductor integrated circuit (IC) including logic circuit and memory cells (memory arrays) according to an embodiment of the present disclosure.

In some embodiments, a semiconductor device includes transistors forming logic circuitry disposed on a substrate. The transistors include an n-type field effect transistor (NFET) and a p-type field effect transistor (PFET). In some embodiments, the transistors are fin FETs (FIN FETs), gate-all-around FETs (GAA FETs), or planer FETs.

The transistors are formed over a substrate 10. In some embodiments, the transistors are FIN FETs formed over fin structures 20. The transistors further include a gate structure 40 and a source/drain region 50. The transistors are electrically separated from other transistors by an isolation insulating layer 30, such as a shallow trench isolation (STI) layer. The transistors are covered by a dielectric layer 60, and source/drain contacts 70 are disposed in the dielectric layer 60.

The transistors are connected to various metal wirings and vias (contact plugs) vertically connecting metal wirings. In some embodiments, the semiconductor device includes multiple wiring layers Mx, where x=1, 2, 3, . . . . Although FIG. 1 shows seven (7) metal wiring layers M1, M2, M3, M4, M5, M6 and M7, the number of the metal wiring layers (x) can be less than 7 or more than 7. In some embodiments, the number of layers is up to 20.

Each of the metal wiring layers includes one or more interlayer dielectric (ILD) layers, vias to the lower wiring layers and metal wirings. For example, the first metal wiring layer M1 includes a first ILD layer 110, a first via 112 and a first metal wiring 114; the second metal wiring layer M2 includes a second ILD layer 120, a second via 122 and a second metal wiring 124; the third metal wiring layer M3 includes a third ILD layer 130, a third via 132 and a third metal wiring 134; the fourth metal wiring layer M4 includes a fourth ILD layer 140, a fourth via 142 and a fourth metal wiring 144; the fifth metal wiring layer M5 includes a fifth ILD layer 150, a fifth via 152 and a fifth metal wiring 154; the sixth metal wiring layer M6 includes a sixth ILD layer 160, a sixth via 162 and a sixth metal wiring 164; and the seventh metal wiring layer M7 includes a seventh ILD layer 170, a seventh via 172 and a seventh metal wiring 174.

In some embodiments, the directions that the metal wirings of adjacent layers extend cross each other (e.g., perpendicular to each other). For example, when the first metal wiring 114 extends in the X direction, the second metal wiring 124 extends in the Y direction, and the third metal wiring 134 extends in the X direction. The design rules of the wiring layer (e.g., pitches of the metal wirings) generally increases as the wiring level increases.

In some embodiments, the memory arrays 203 and 207 are disposed in the M3 and M4 metal wiring layers, respectively. The memory arrays 203 and 207 include a lower memory layer 202 and 206, and an upper layer memory layer 204 and 208, respectively, in some embodiments.

In some embodiments, metal wiring layers M1 and M2 are used for peripheral circuits RP of the memory arrays, e.g., row (word line) and column (bit line) decoders. In some embodiments. The peripheral circuit RP is located below the memory array 203 and 207. The peripheral circuit RP includes vias 112A, 122A and metal wirings 114A and 124A in some embodiments.

In some embodiments, the transistors are manufactured at front-end-of-line (FEOL) manufacturing operations. The metal wirings are manufactured at back-end-of-line (BEOL) manufacturing operations.

Figure 1B:
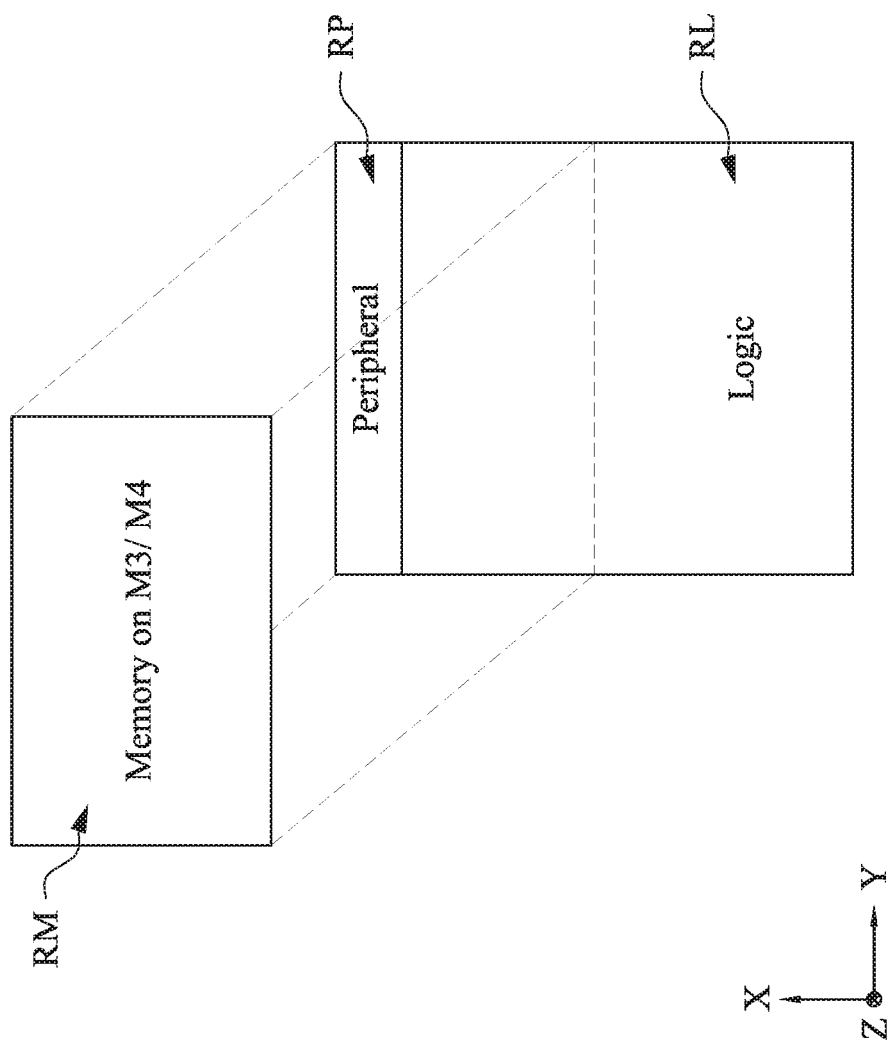
FIG. 1B shows a floor plan (layout) of a semiconductor integrated circuit (IC) including logic circuit and memory cells according to an embodiment of the present disclosure.

FIG. 1B shows a floor plan (layout) of a semiconductor integrated circuit (IC) including logic circuit and memory cells according to an embodiment of the present disclosure.

As set forth above, the peripheral circuit RP of the memory array is located below the memory array region RM as shown in FIGS. 1A and 1B. The area of the peripheral circuit RP is less than about 20% of the total area under the memory array region RM. In some embodiments, the area of the peripheral circuit RP is less than about 10% and more than about 1% of the total area under the memory array region RM.

FIGS. 2-10 show a sequential operation to manufacture the semiconductor device shown in FIG. 1A according to an embodiment of the present disclosure. It is understood that additional operations can be provided before, during, and after processes shown by FIGS. 2-10, and some of the operations described below can be replaced or eliminated, for additional embodiments of the method. The order of the operations/processes may be interchangeable.

Figure 2:
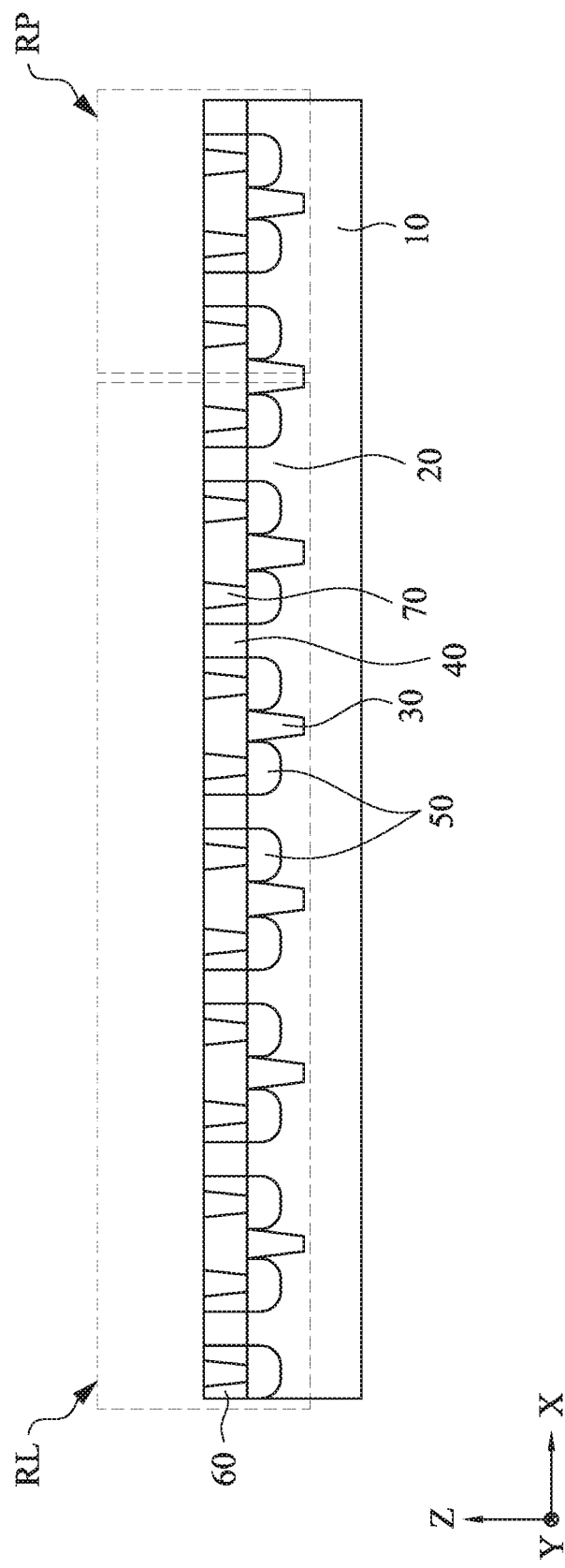
FIG. 2 shows a cross-sectional view of one of the various stages of a sequential manufacturing operation of the semiconductor IC according to an embodiment of the present disclosure.

FIG. 2 shows a cross-sectional view of one of the various stages of a sequential manufacturing operation of the semiconductor IC according to an embodiment of the present disclosure. In FIG. 2, transistors (e.g., FIN FETs) are formed over a substrate 10.

The substrate 10 is, for example, a p-type silicon substrate with an impurity concentration in a range of about $1\times10^{15}$ cm$^{-3}$ to about $1\times10^{18}$ cm$^{-3}$. In other embodiments, the substrate 10 is an n-type silicon substrate with an impurity concentration in a range of about $1\times10^{15}$ cm$^3$ to about $1\times10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

After the fin structures 20 are formed, an isolation insulating layer 30 is formed. The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

In some embodiments, a gate replacement technology is employed. In the gate replacement technology, a dummy gate structure is formed over part of the fin structures. A dielectric layer and a poly silicon layer are formed, and then patterning operations are performed so as to obtain a dummy gate structure including a dummy gate electrode layer made of poly silicon and a dummy gate dielectric layer. The patterning of the poly silicon layer is performed by using a hard mask including a silicon nitride layer and an oxide layer in some embodiments. The dummy gate dielectric layer may be silicon oxide formed by CVD, PVD, ALD, e-beam evaporation, or other suitable process. In some embodiments, the dummy gate dielectric layer may include one or more layers of silicon oxide, silicon nitride, silicon oxynitride, or high-k dielectrics. In some embodiments, the dummy gate electrode layer may be doped poly-silicon with uniform or non-uniform doping.

Further, sidewall spacers are formed on opposite side faces of the dummy gate structures. An insulating material layer for sidewall spacers is formed over the dummy gate structure. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers.

Subsequently, a source/drain region 50 of the fin structure 20 not covered by the dummy gate structure is etched down (recessed) to form a source/drain recess in some embodiments. After the source/drain recess is formed, one or more source/drain epitaxial layers 50 are formed in the source/drain recess. In some embodiments, a first epitaxial layer, a second epitaxial layer and a third epitaxial layer are formed. In other embodiments, no recess is formed and the epitaxial layers are formed over the fin structure. In some embodiments, the first epitaxial layer includes SiP or SiCP for an n-type FinFET, and SiGe doped with B for a p-type FINFET, in the some embodiments.

Then, a dielectric layer 60 is formed over the S/D epitaxial layer and the dummy gate structure. The materials for the dielectric layer include compounds including Si, 0, C and/or H, such as silicon oxide, SiCOH, SiOC, and SiOCN, low-k material, organic material or any other suitable dielectric material. After the dielectric layer 60 is formed, a planarization operation, such as CMP, is performed, so that the top portion of the dummy gate electrode layer is exposed. In some embodiments, before the dielectric layer 60 is formed, a contact etch stop layer, such as a silicon nitride layer or a silicon oxynitride layer, is formed. Then, the dummy gate electrode layer and the dummy gate dielectric layer are removed, thereby forming a gate space. After the dummy gate structure is removed, a channel region of the fin structure 20 is exposed in the gate space.

Then, an interfacial layer is formed on the fin structure 20 and a gate dielectric layer is formed on the interfacial layer. In some embodiments, the interfacial layer is formed by using chemical oxidation. In some embodiments, the gate dielectric layer includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, La$_2$O$_3$, HfO$_2$—La$_2$O$_3$, Y$_2$O$_3$ or other suitable high-k dielectric materials, and/or combinations thereof.

Then, multiple conductive layers including a barrier layer, one or more work function adjustment layers and a body gate metal layer is formed over the gate dielectric layer. In some embodiments, the barrier layer includes one or more of TaN, TiN, Ti and Ta. In some embodiments, the work function adjustment layer is made of a conductive material such as a single layer of TiN, WN, TaAlC, TiC, TaC, Co, Al, TiAl, or TiAlC, or a multilayer of two or more of these materials. For the n-channel FET, one or more of TaN, TaAlC, TiN, TiC, Co, or TiAl is used as the work function adjustment layer, and for the p-channel FET, one or more of TiAlC, Al, TiAl, TaN, TaAlC, TiN, WN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The body gate metal layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The body metal layer may be formed by CVD, ALD, electro-plating, or other suitable method. In the embodiment of FIG. 2, the gate structure 40 includes at least the interfacial layer, the gate dielectric layer, the barrier layer, the work function adjustment layer, and a body metal layer as well as the sidewall spacers.

Further, source/drain contacts 70 are formed in the dielectric layer 60. The source/drain contacts are made of conductive material, such as Co, Ni, W, Cu, Al, Mo, Ti, Ta and an alloy thereof, or any other suitable conductive material.

The transistors for the logic circuit RL and the peripheral circuit RP of the memory array are concurrently formed in some embodiments.

Figure 3:
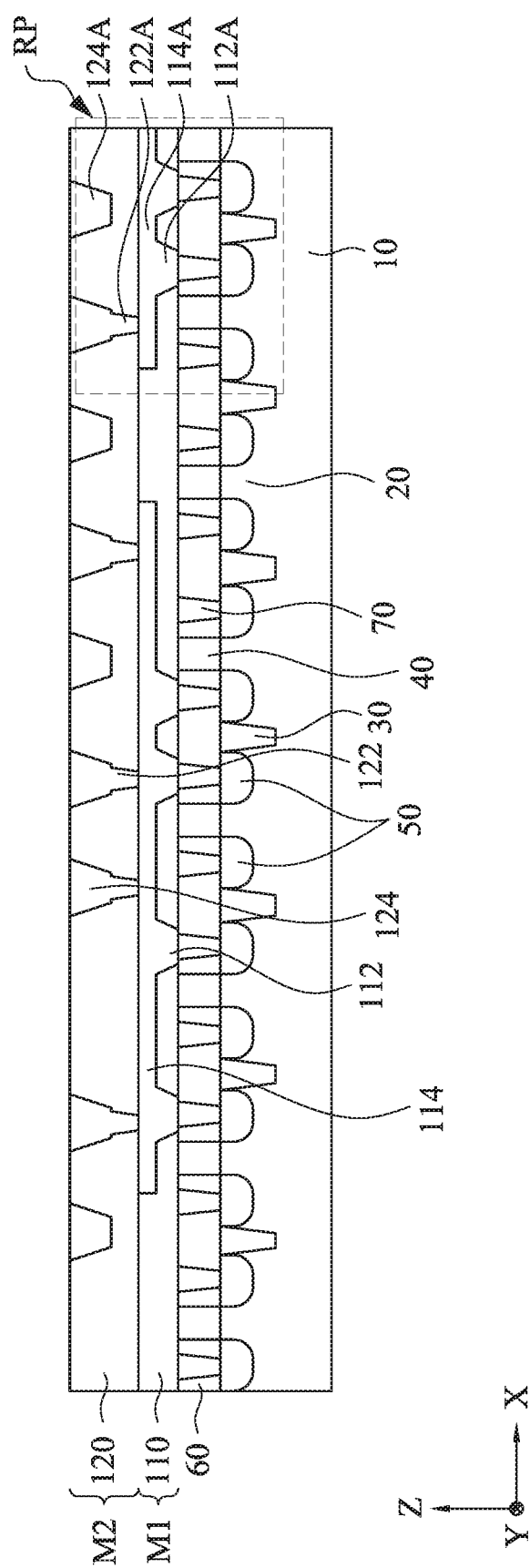
FIG. 3 shows a cross-sectional view of one of the various stages of a sequential manufacturing operation of the semiconductor IC according to an embodiment of the present disclosure.

FIG. 3 shows a cross-sectional view of one of the various stages of a sequential manufacturing operation of the semiconductor IC according to an embodiment of the present disclosure.

Subsequently, metal wiring layers M1 and M2 are formed over the transistors. The M1 wiring layer includes a first ILD layer 110, first vias 112 and first metal wirings 114. The M2 wiring layer includes a second ILD layer 120, second vias 122 and second metal wirings 124. The first and second ILD layers 110 and 120 are made of a material including Si, O, C and/or H, such as silicon oxide, SiCOH, SiOC, and SiOCN, low-k material, organic material or any other suitable dielectric material. The materials for the first ILD layer 110 are the same as or different from that of the dielectric layer 60, and the materials for the second ILD layer 120 are the same as or different from that of the first ILD layer 60. The first and second vias 112 and 122 and/or the first and second metal wirings 114 and 124 are formed by using, for example, single or dual damascene techniques.

Figure 4:
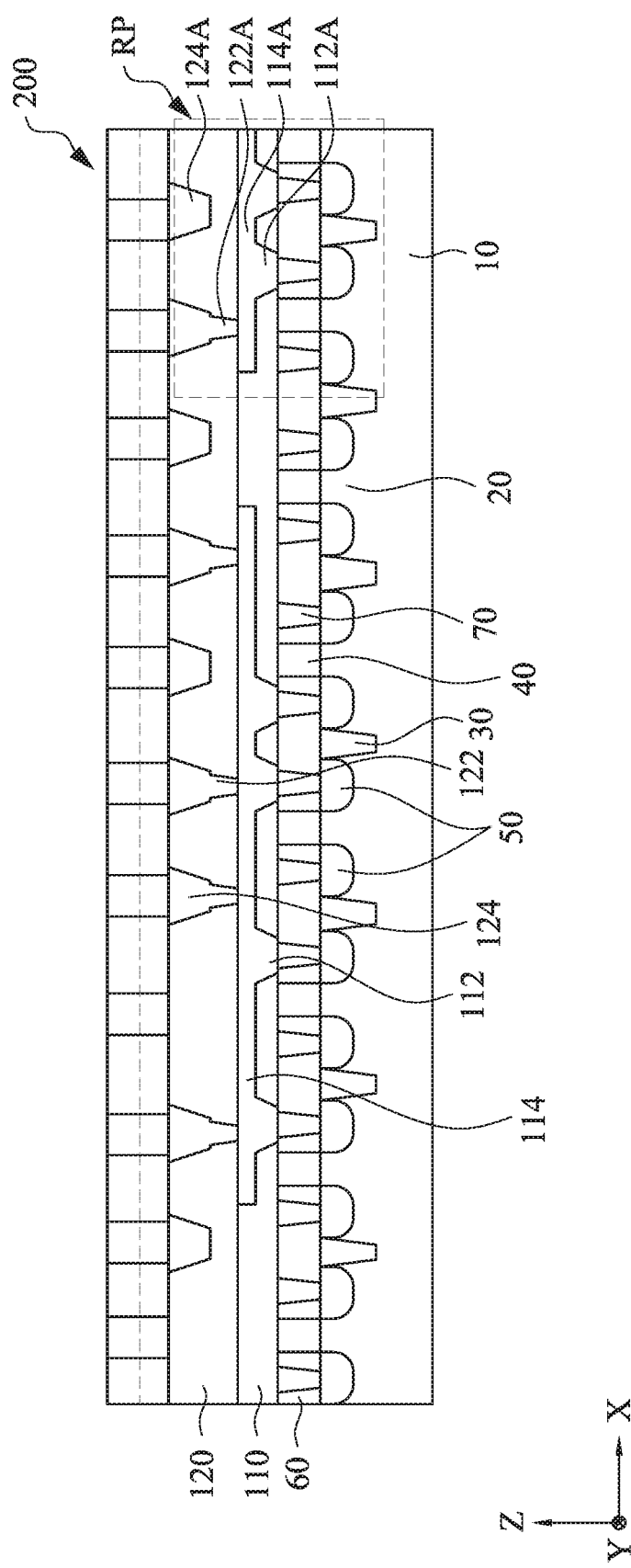
FIG. 4 shows a cross-sectional view of one of the various stages of a sequential manufacturing operation of the semiconductor IC according to an embodiment of the present disclosure.

FIG. 4 shows cross-sectional views of one of the various stages of a sequential manufacturing operation of the semiconductor IC according to an embodiment of the present disclosure.

Subsequently, lower memory layers 200 are formed over the second ILD layer 120 and the second metal wirings 124. Operations to manufacture the lower memory layers 200 and memory arrays are explained later. In some embodiments, the lower memory layers 200 are formed over the entire upper surface of the structure shown in FIG. 4. In other embodiments, the lower memory layers 200 are formed on a limited region while the remaining region is covered by a protective layer.

Figure 5:
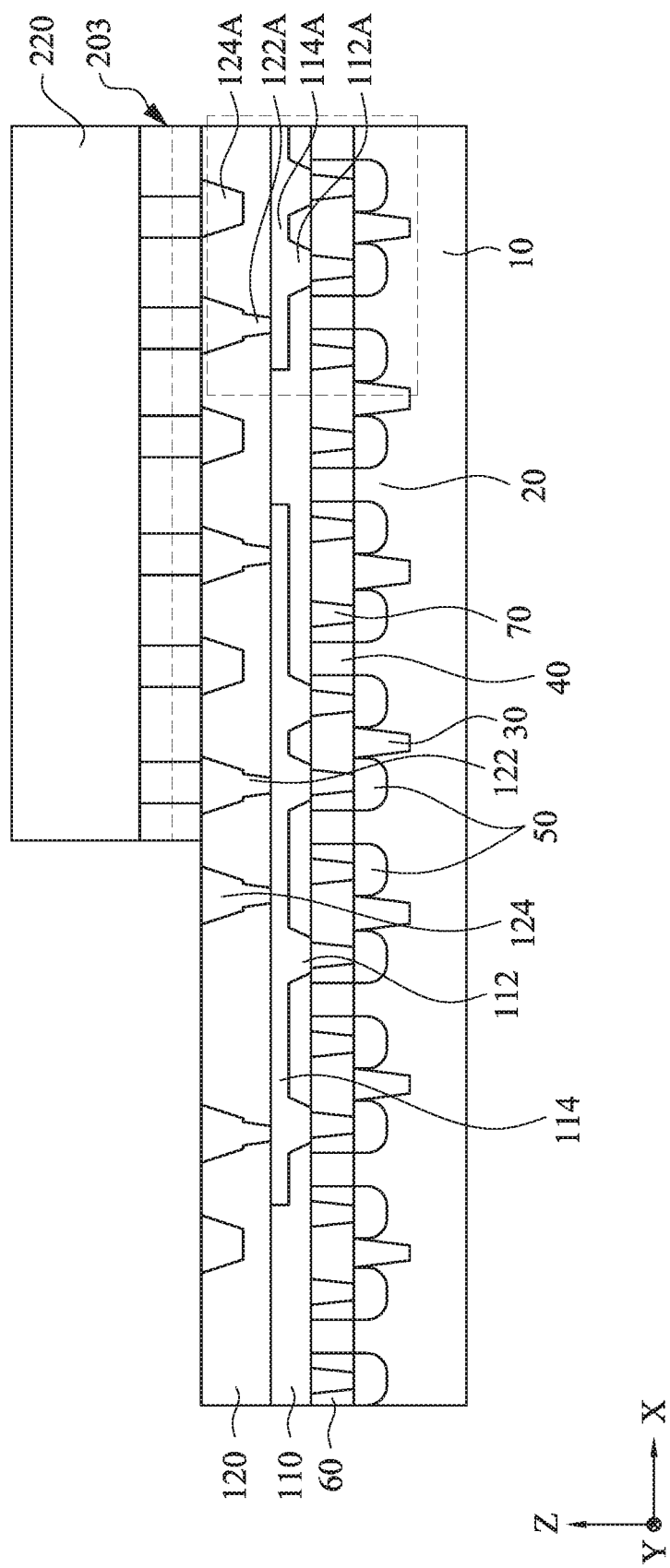
FIG. 5 shows a cross-sectional view of one of the various stages of a sequential manufacturing operation of the semiconductor IC according to an embodiment of the present disclosure.

FIG. 5 shows a cross-sectional view of one of the various stages of a sequential manufacturing operation of the semiconductor IC according to an embodiment of the present disclosure.

After the lower memory layers 200 are formed, part of the lower memory layers 200, which subsequently becomes the memory arrays, is covered by a mask layer 220, such as a photo resist pattern, and the exposed part of the lower memory layers 200 are removed by suitable etching operations. By this etching operation, the lower memory arrays 203 are formed. The mask layer 220 is then removed.

Figure 6:
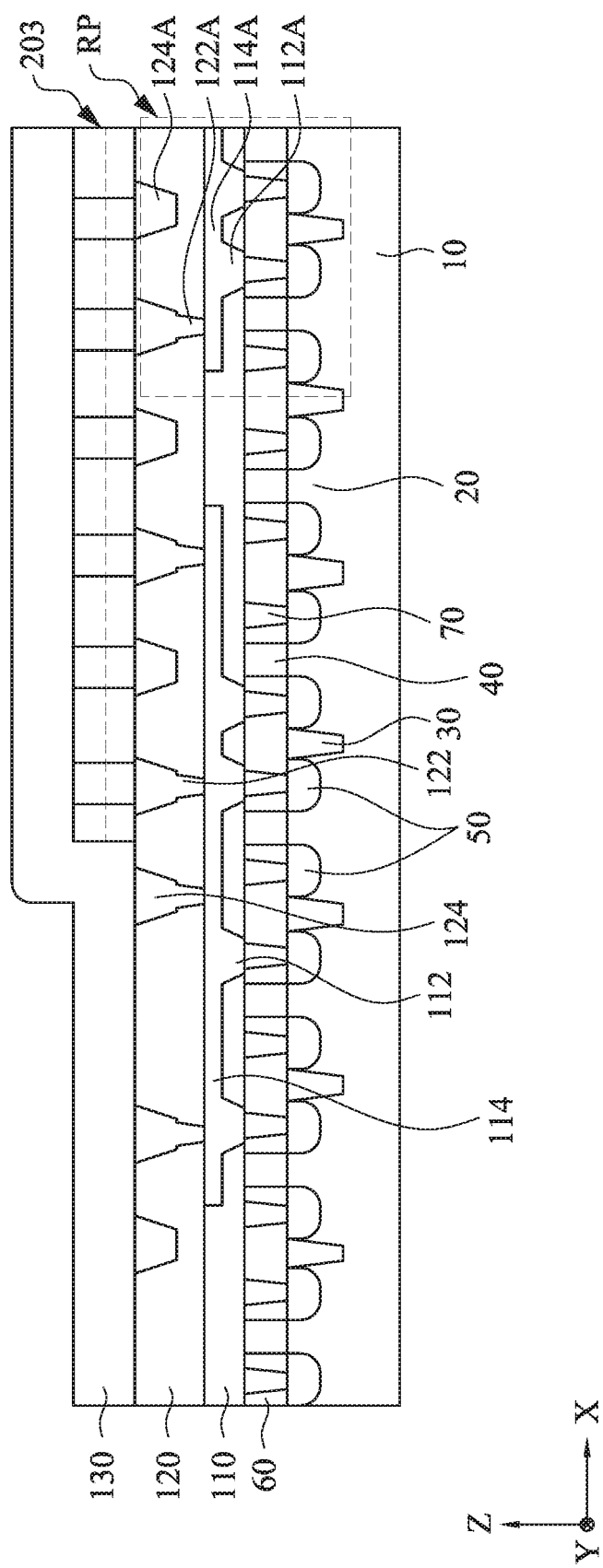
FIG. 6 shows a cross-sectional view of one of the various stages of a sequential manufacturing operation of the semiconductor IC according to an embodiment of the present disclosure.

FIG. 6 shows a cross-sectional view of one of the various stages of a sequential manufacturing operation of the semiconductor IC according to an embodiment of the present disclosure.

After the mask layer 220 is remove, a third ILD layer 130 is formed over the lower memory arrays 203 and the second ILD layer 120. The third ILD layer 130 is made of a material including Si, O, C and/or H, such as silicon oxide, SiCOH, SiOC, and SiOCN, low-k material, organic material or any other suitable dielectric material. The materials for the third ILD layer 130 are the same as or different from that of the second ILD layer 120.

Figure 7:
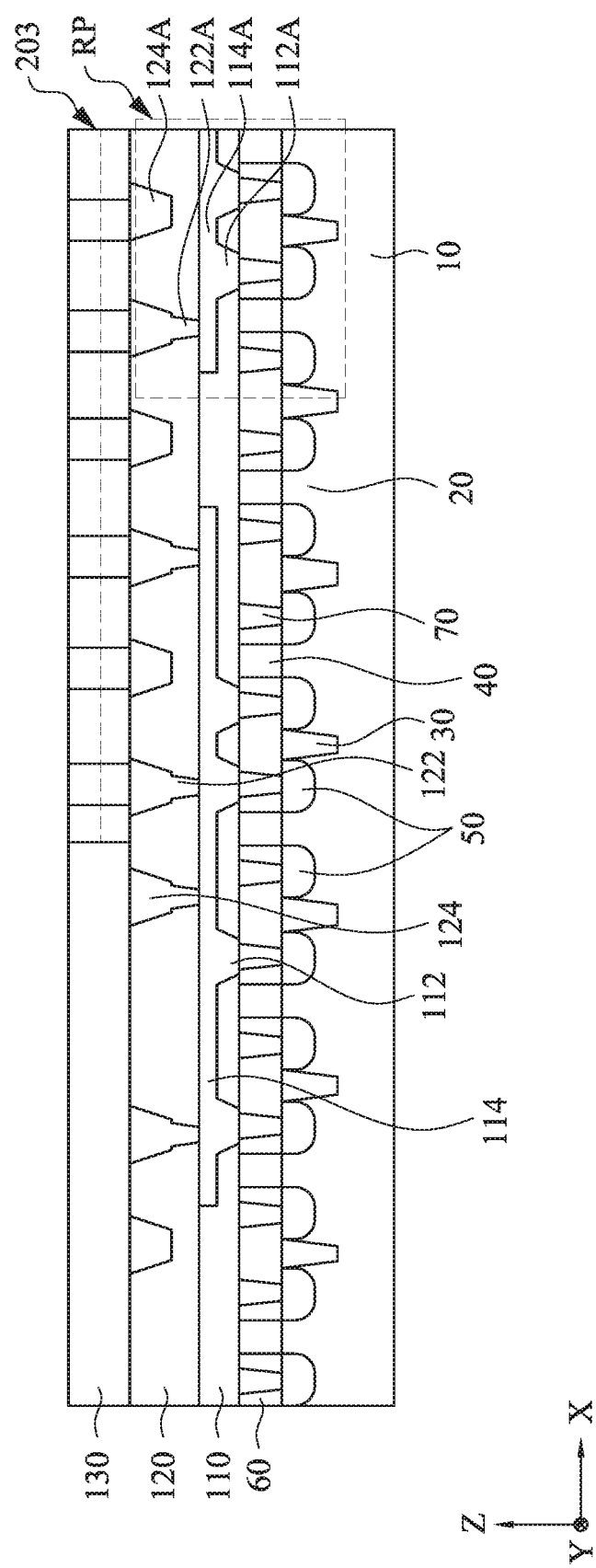
FIG. 7 shows a cross-sectional view of one of the various stages of a sequential manufacturing operation of the semiconductor IC according to an embodiment of the present disclosure.

FIG. 7 shows a cross-sectional view of one of the various stages of a sequential manufacturing operation of the semiconductor IC according to an embodiment of the present disclosure.

A planarization operation, such as CMP, is subsequently performed to flatten the third ILD layer 130 and to expose the upper surface of the lower memory array 203. In some embodiments, an etch stop layer, such as a silicon nitride layer, is formed over the lower memory array 203 and/or the second ILD layer 120. In such a case, the CMP operation stops at the etch stop layer.

Figure 8:
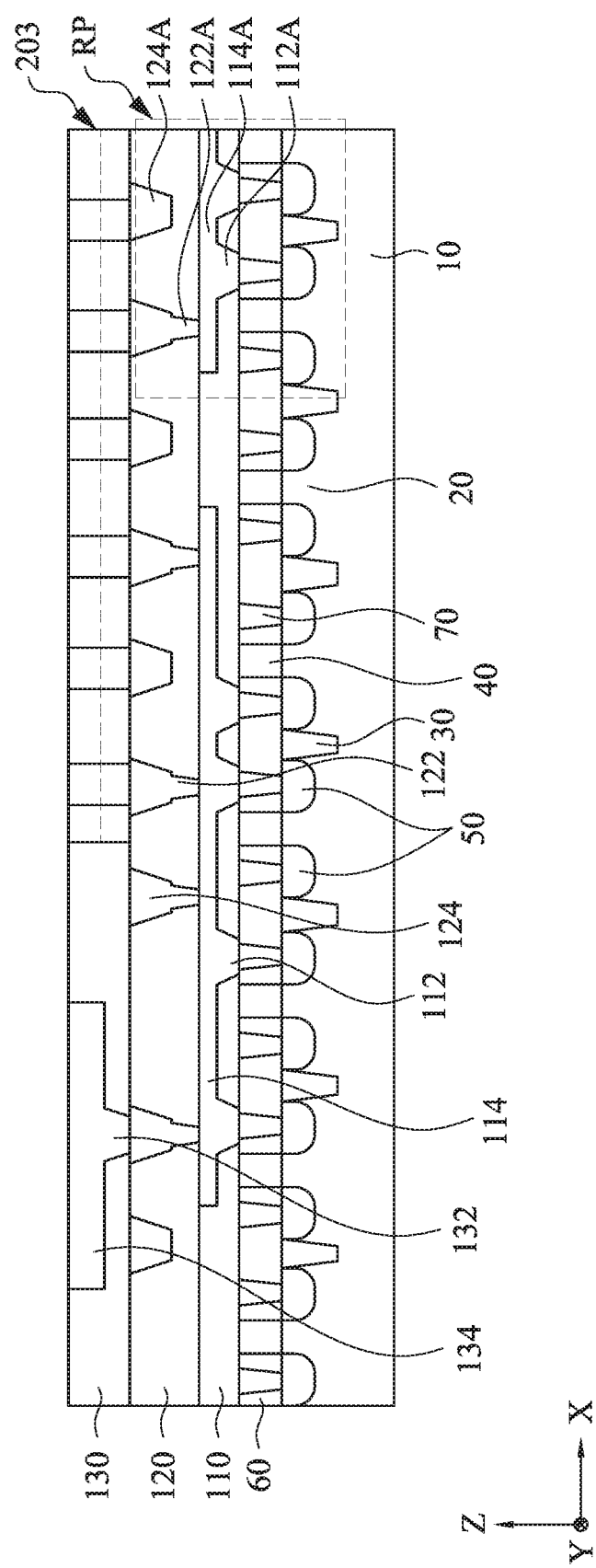
FIG. 8 shows a cross-sectional view of one of the various stages of a sequential manufacturing operation of the semiconductor IC according to an embodiment of the present disclosure.

FIG. 8 shows a cross-sectional view of one of the various stages of a sequential manufacturing operation of the semiconductor IC according to an embodiment of the present disclosure.

After the planarization operation is performed, third vias 132 and third metal wirings 134 are formed by using a single or dual damascene technique.

Figure 9:
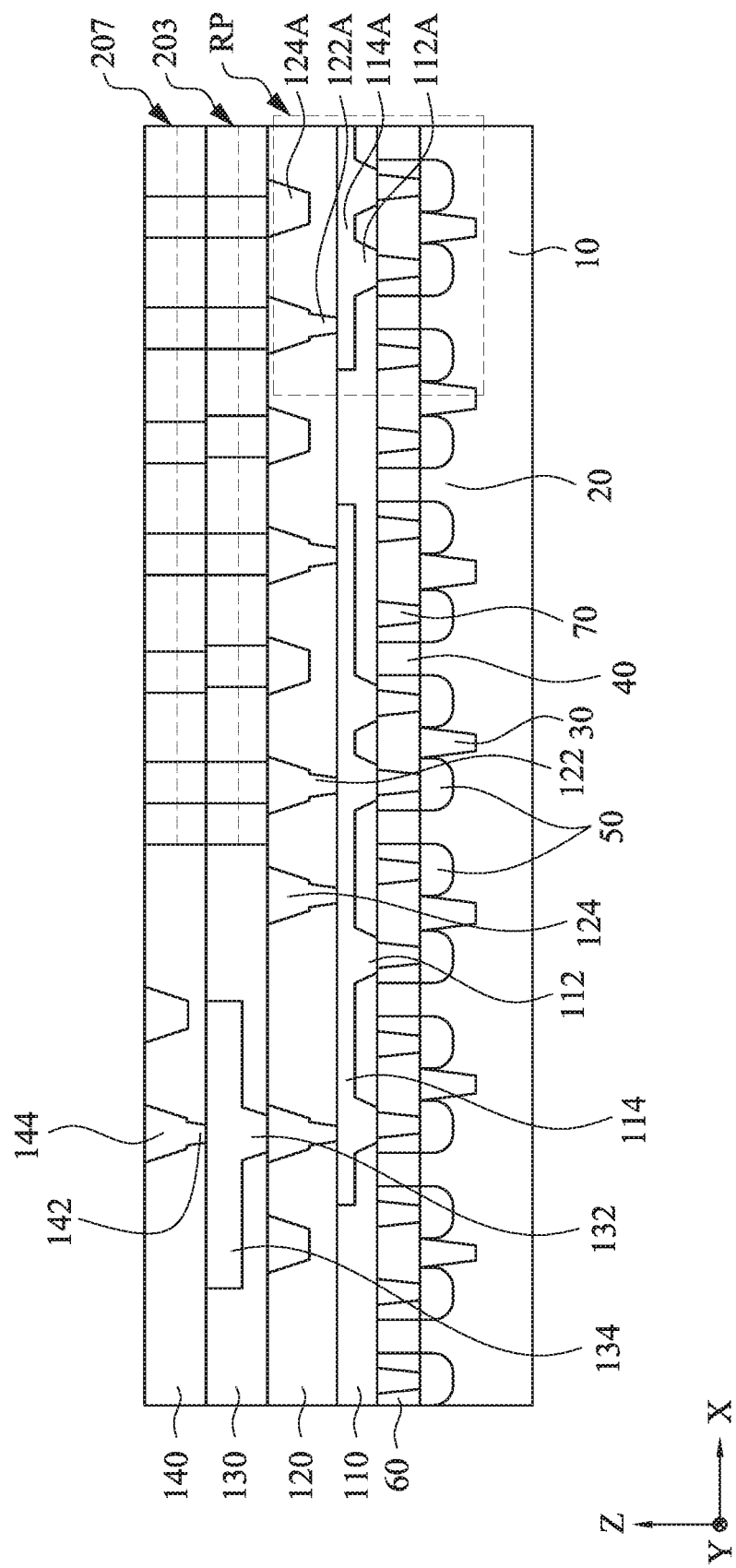
FIG. 9 shows a cross-sectional view of one of the various stages of a sequential manufacturing operation of the semiconductor IC according to an embodiment of the present disclosure.

FIG. 9 shows a cross-sectional view of one of the various stages of a sequential manufacturing operation of the semiconductor IC according to an embodiment of the present disclosure.

The operations explained in FIGS. 4-8 are repeated to form upper memory arrays 207, a fourth ILD layer 140, fourth vias 142 and fourth metal wirings 144 for the fourth wiring layer M4 are formed.

Figure 10:
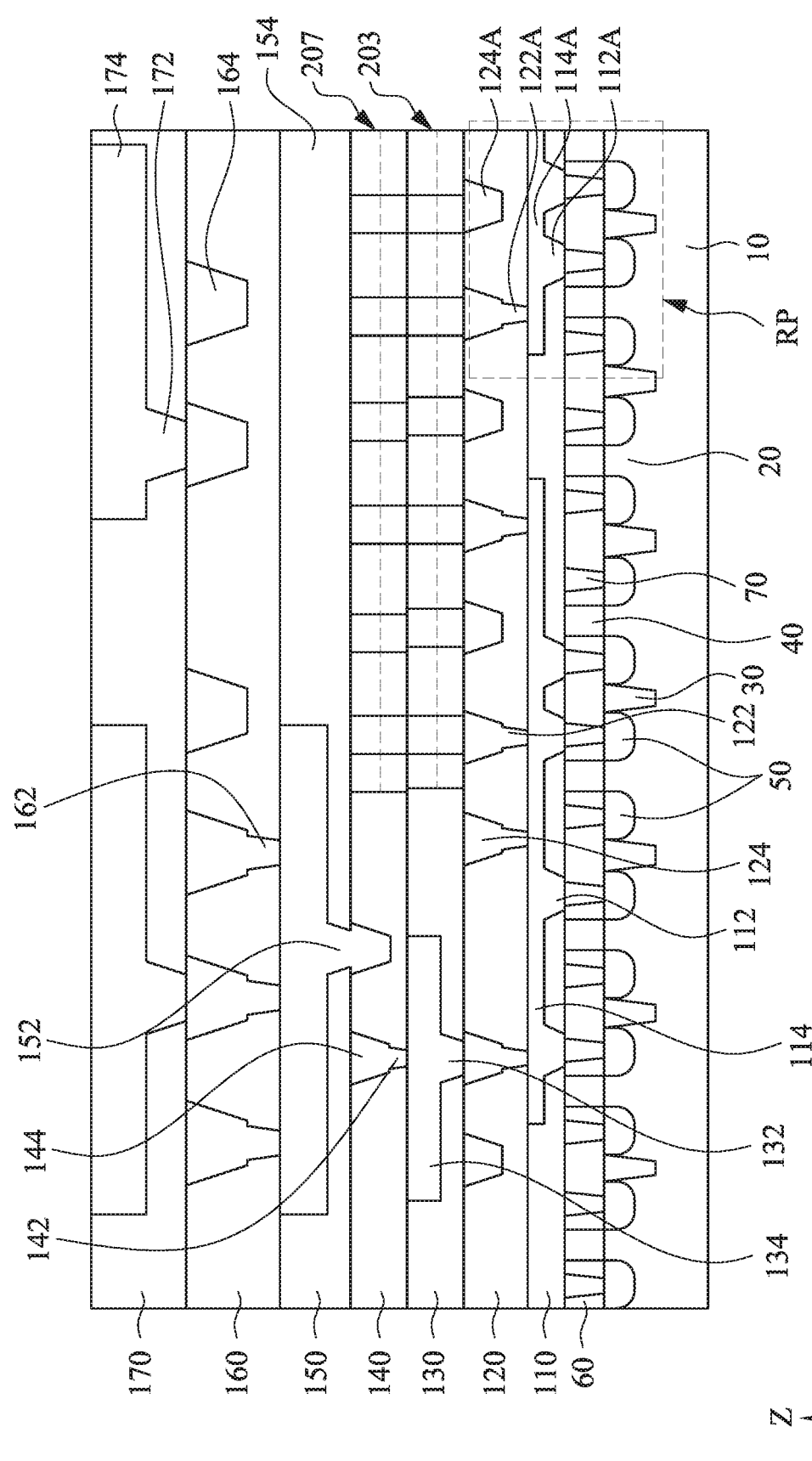
FIG. 10 shows a cross-sectional view of one of the various stages of a sequential manufacturing operation of the semiconductor IC according to an embodiment of the present disclosure.

Operations of forming an ILD layer and vias and metal wirings are repeated to form metal wiring layers M5-M7 shown in FIG. 10. FIG. 10 shows a cross-sectional view of one of the various stages of a sequential manufacturing operation of the semiconductor IC according to an embodiment of the present disclosure, which is the same as FIG. 1A.

FIGS. 11-20B show a sequential operation to manufacture the memory layers 200 according to an embodiment of the present disclosure. It is understood that additional operations can be provided before, during, and after processes shown by FIGS. 11-20B, and some of the operations described below can be replaced or eliminated for additional embodiments of the method. The order of the operations/processes may be interchangeable.

Figure 11:
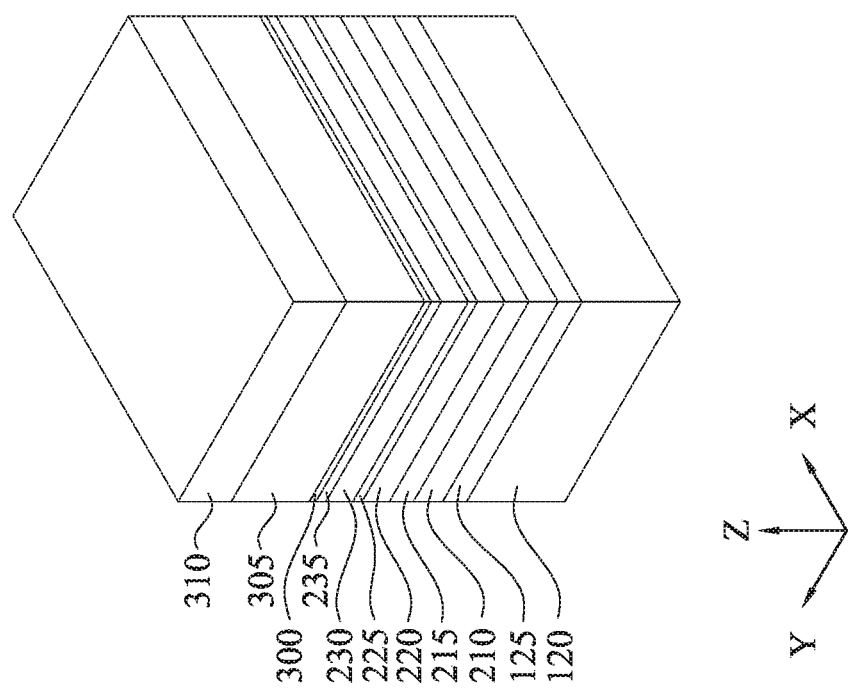
FIG. 11 shows a perspective view of one of the various stages of a sequential manufacturing operation of memory cell portion of the semiconductor IC according to an embodiment of the present disclosure.

FIG. 11 shows a perspective view of one of the various stages of a sequential manufacturing operation of the memory layers 200 of the semiconductor IC according to an embodiment of the present disclosure.

As shown in FIG. 11, a stacked layer is formed over an ILD layer, e.g., the second ILD layer 120. The stacked layer includes, from the bottom to the top, an etch stop layer 125, a first conductive layer 210, a first insulating layer 215, a second conductive layer 220, a second insulating layer 225, a third insulating layer 230 and a fourth insulating layer 235, in some embodiments. Further, a mask layer including a first mask layer 300, a second mask layer 305 and a third mask layer 310 is are formed over the fourth insulating layer 235.

In some embodiments, the first and second conductive layers 210 and 220 include W, Co, Ni, Cu, Al, Ti, Ta, alloy thereof, silicide, or any other suitable conductive material. In certain embodiments, the first and second conductive layers 210 and 220 are made of W. The first and second conductive layers 210 and 220 are subsequently patterned to form bit lines. In some embodiments, the thickness of the first and second conductive layers 210 and 220 is in a range from about 20 nm to about 40 nm. The thicknesses of the first and second conductive layers 201 and 220 may be equal to or different from each other. The first and second conductive layers can be formed by ALD, PVD, CVD, e-beam evaporation, or other suitable process.

The etch stop layer 125 is made of a silicon nitride based material, such as silicon nitride or silicon oxynitride. In some embodiments, the thickness of the etch stop layer 125 is in a range from about 5 nm to about 20 nm. The etch stop layer can be formed by ALD, CVD, or other suitable process.

The first insulating layer 215 is made of a silicon oxide based material, such as silicon oxide or silicon oxynitride. In certain embodiments, silicon oxide is used. In some embodiments, the thickness of the first insulating layer 215 is in a range from about 5 nm to about 20 nm. The first insulating layer can be formed by ALD, CVD, or other suitable process.

The second insulating layer 225 is made of an insulating material other than a silicon based insulating material (e.g., silicon oxide and silicon nitride). In some embodiments, the second insulating layer 225 includes an aluminum based insulating material, such as aluminum oxide or AlON or AN. In certain embodiments, aluminum oxide is used. In some embodiments, the thickness of the second insulating layer 225 is in a range from about 1 nm to about 10 nm. The second insulating layer can be formed by ALD, CVD, or other suitable process.

The third insulating layer 230 is made of a silicon oxide based material, such as silicon oxide or silicon oxynitride. In certain embodiments, silicon oxide is used. In some embodiments, the thickness of the third insulating layer 230 is in a range from about 5 nm to about 20 nm. The third insulating layer can be formed by ALD, CVD, or other suitable process.

The fourth insulating layer 235 is made of a silicon nitride based material, such as silicon nitride or silicon oxynitride. In certain embodiments, silicon nitride is used. In some embodiments, the thickness of the fourth insulating layer 235 is in a range from about 1 nm to about 10 nm. The fourth insulating layer can be formed by ALD, CVD, or other suitable process.

In some embodiments, the first mask layer 300 includes silicon oxide, the second mask layer 305 includes silicon nitride and the third mask layer includes silicon oxide.

Figure 12:
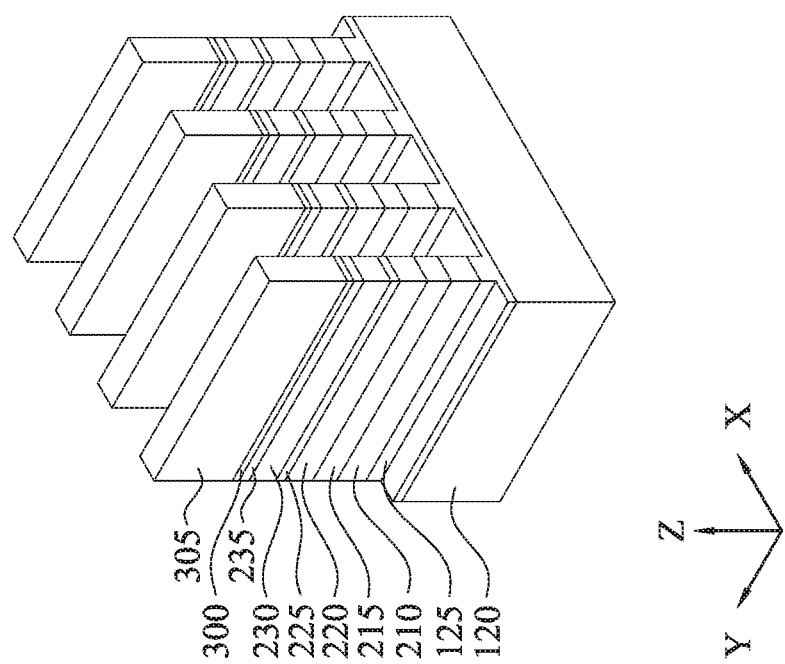
FIG. 12 shows a perspective view of one of the various stages of a sequential manufacturing operation of memory cell portion of the semiconductor IC according to an embodiment of the present disclosure.

FIG. 12 shows a perspective view of one of the various stages of a sequential manufacturing operation of the memory layers 200 of the semiconductor IC according to an embodiment of the present disclosure.

As shown in FIG. 12, the stacked layer is then patterned by one or more lithography and etching operations to form bit lines. In some embodiments, a photo resist layer is formed over the third mask layer 310 and is patterned by one or more lithography operations. By using the patterned photo resist layer as an etching mask, one or more layers of the hard mask layer are etched. Then, by using the patterned hard mask as an etching mask, the stacked layer is patterned, as shown in FIG. 12. In some embodiments, the second mask layer 305 is patterned by using the patterned third mask layer 310, and by using the patterned second mask layer 305 as an etching mask, the stacked layer is patterned. In some embodiments, a part of the etch stop layer 125 is removed.

Figure 13:
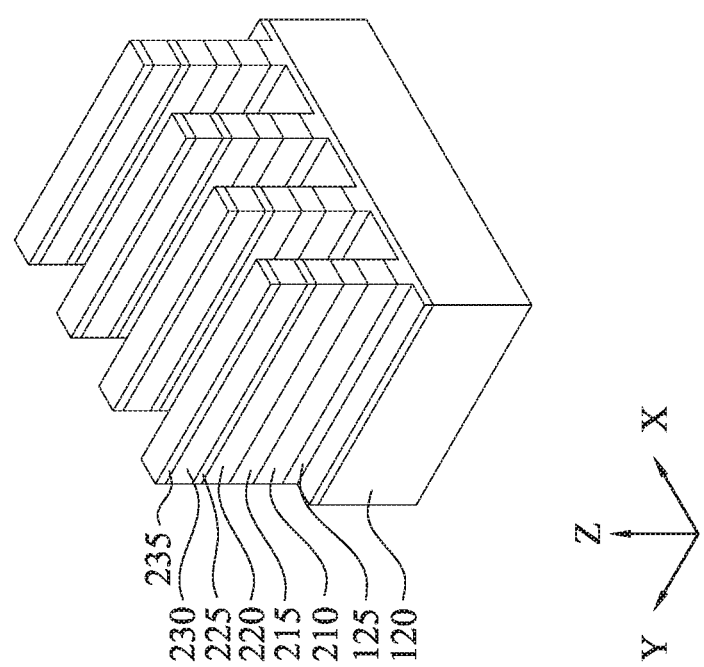
FIG. 13 shows a perspective view of one of the various stages of a sequential manufacturing operation of memory cell portion of the semiconductor IC according to an embodiment of the present disclosure.

FIG. 13 shows a perspective view of one of the various stages of a sequential manufacturing operation of the memory layers 200 of the semiconductor IC according to an embodiment of the present disclosure.

After the patterning, the mask layer, e.g., the second and first mask layers 305 and 300, are removed. As shown in FIG. 13, line-and-space patterns are obtained, and the fourth insulating layer 235 is exposed at the top of line patterns. In some embodiments, the width of the line patterns (bit line patterns) is in a range from about 10 nm to about 50 nm and the pitch of the line-and-space patterns is in a range from about 20 nm to about 200 nm.

Figure 14:
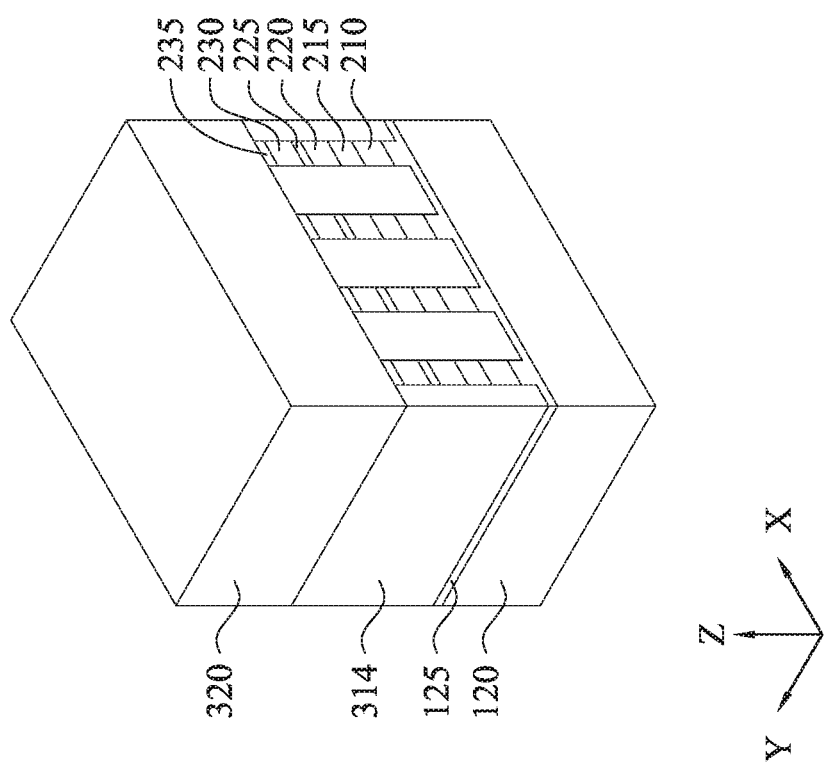
FIG. 14 shows a perspective view of one of the various stages of a sequential manufacturing operation of memory cell portion of the semiconductor IC according to an embodiment of the present disclosure.

FIG. 14 shows a perspective view of one of the various stages of a sequential manufacturing operation of the memory layers 200 of the semiconductor IC according to an embodiment of the present disclosure.

An isolation layer 314 is then formed and a hard mask layer 320 is formed over the isolation layer 314. The isolation layer 314 is made of silicon oxide based material, such as silicon oxide or silicon oxynitride. In certain embodiments, silicon oxide is used. The hard mask layer 320 is made of a silicon nitride based material, such as silicon nitride or silicon oxynitride. In certain embodiments, silicon nitride is used. The isolation layer 314 fills the spaces between the bit line patterns and covers the bit line patterns. Then, a planarization operation, such as CMP, is performed to expose the fourth insulating layer 235. The hard mask layer 320 is then formed on the isolation layer 314 and the exposed fourth insulating layer 235. The isolation insulating layer 314 and the hard mask layer 320 can be formed by ALD, CVD, or other suitable process. In some embodiments, the hard mask layer 320 includes multiple layers similar to the hard mask layer shown in FIG. 11.

Figure 15:
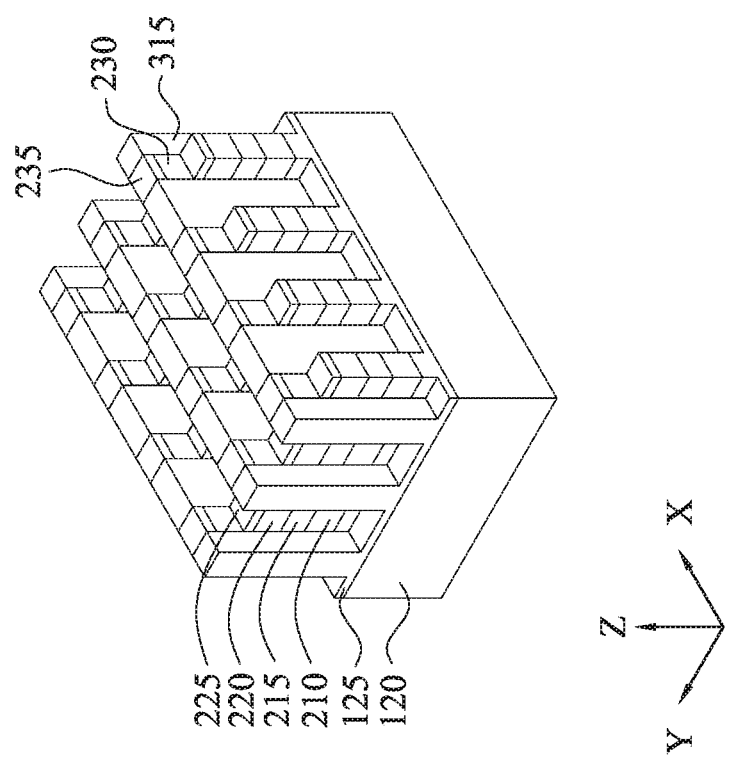
FIG. 15 shows a perspective view of one of the various stages of a sequential manufacturing operation of memory cell portion of the semiconductor IC according to an embodiment of the present disclosure.

FIG. 15 shows a perspective view of one of the various stages of a sequential manufacturing operation of the memory layers 200 of the semiconductor IC according to an embodiment of the present disclosure.

By using one or more lithography and etching operations, isolation wall patterns 315 are formed crossing the bit line patterns.

In some embodiments, a photo resist layer is formed over the hard mask layer 320 and is patterned by one or more lithography operations. By using the patterned photo resist layer as an etching mask, the hard mask layer is etched. Then, by using the patterned hard mask layers as an etching mask, the isolation insulating layer 314 is patterned into the isolation wall patterns 315. Further, part of the fourth insulating layer 235 and the third insulating layer 230, not covered by the patterned hard mask layer is also etched. The etching stops at the second insulating layer 225. Thus, along the X direction, the isolation wall patterns 315 includes part of the isolation layer 314 and the fourth and third insulating layers 235 and 230. In some embodiments, the width of the isolation wall patterns 315 is in a range from about 5 nm to about 50 nm and the pitch of the isolation wall patterns 315 is in a range from about 15 nm to about 150 nm.

Figure 16:
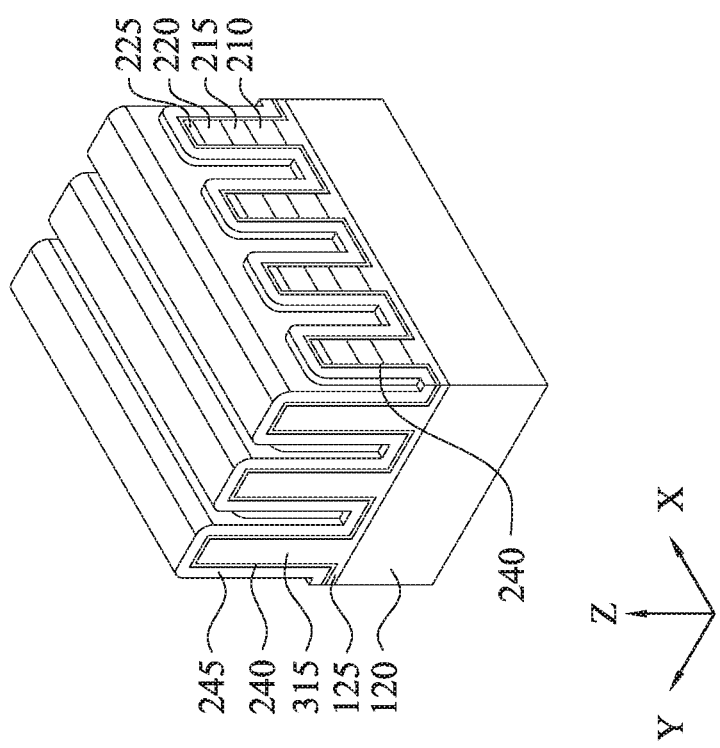
FIG. 16 shows a perspective view of one of the various stages of a sequential manufacturing operation of memory cell portion of the semiconductor IC according to an embodiment of the present disclosure.

FIG. 16 shows a perspective view of one of the various stages of a sequential manufacturing operation of the memory layers 200 of the semiconductor IC according to an embodiment of the present disclosure.

In some embodiments, a memory layer 240 is subsequently formed and further a selector layer 245 is formed over the memory layer 240. In some embodiments, the memory layer 240 includes a phase change material or a resistivity change material. In some embodiments, the memory layer 240 includes non-stoichiometric (e.g., oxygen deficient) metal oxide, such as $HfO_x$, $TiO_x$, $TaO_x$, $ZrO_x$, $WO_x$, $AlO_x$, $NbO_x$, $FeO_x$, $GeO_x$ or $GdO_x$, or a metal oxide, such as NiO, CeO, NiO, ZrO and CuO. In other embodiments, the memory layer 240 includes a binary phase change material, such as GeSb, InSb, InSe, SbTe, GeTe, and/or GaSb; a ternary system, such as GeSbTe, InSbTe, GaSeTe, SnSbTe, InSbGe, and/or GaSbTe; or a quaternary system, such as GeSnSbTe, GeSbSeTe, TeGeSbS, GeSbTeO, and/or GeSbTeN. In certain embodiments, the phase change material is a Ge—Sb—Te alloy (e.g., $Ge_2Sb_2Te_5$) with or without nitrogen doping and/or silicon oxide. In other embodiments, the memory layer 240 includes a ferroelectric material, such as, $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_c$-$Nb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), or $Ta_2O_5$. In some embodiments, $PbZr_{0.5}Ti_{0.5}O_3$ or $Hf_{0.5}Zr_{0.5}O_2$ is used as the ferroelectric layer. In some embodiments, the selector material layer is not used. For example, a FRAM does not utilize a selector material layer.

The thickness of the memory layer 240 is in a range from about 2 nm to about 10 nm in some embodiments, and is in a range from about 3 nm to about 5 nm in other embodiments. The memory layer 240 can be formed by ALD, CVD, or other suitable process.

In some embodiments, the selector material layer 245 includes one or more materials selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In other embodiments, the selector material layer is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In certain embodiments, the selector material layer 240 is a chalcogenide or a solid-electrolyte material containing one or more of Ge, Sb, S, and Te. The thickness of the selector material layer 245 is in a range from about 5 nm to about 20 nm in some embodiments, and is in a range from about 10 nm to about 14 nm in other embodiments. The selector material layer 245 can be formed by ALD, CVD, or other suitable process.

Figure 17:
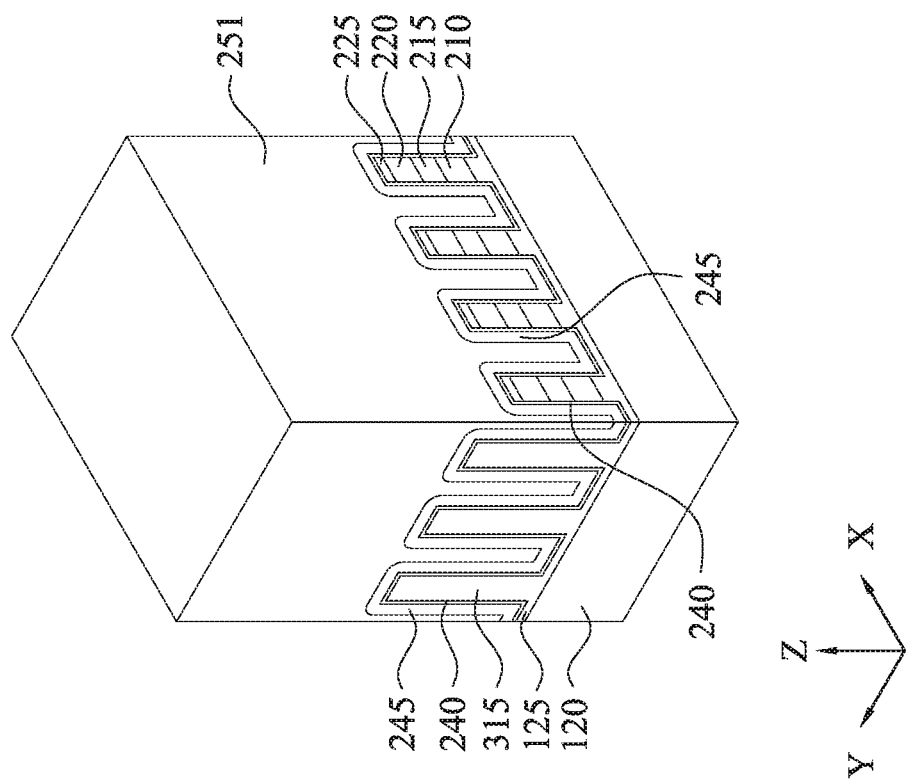
FIG. 17 shows a perspective view of one of the various stages of a sequential manufacturing operation of memory cell portion of the semiconductor IC according to an embodiment of the present disclosure.

FIG. 17 shows a perspective view of one of the various stages of a sequential manufacturing operation of the memory layers 200 of the semiconductor IC according to an embodiment of the present disclosure.

A third conductive layer 251 is then formed over the selector material layer 245. In some embodiments, the third conductive layer 251 includes W, Co, Ni, Cu, Al, Ti, Ta, alloys thereof, silicides thereof, or any other suitable conductive material. In certain embodiments, the third conductive layer 251 is made of W. The third conductive layer 251 fills the spaces between the selector materials (bit line patterns and separation wall patterned) and fully covers the selector material layer 245. The third conductive layer 251 is subsequently patterned to form word lines. The third conductive layer 251 can be formed by CVD, ALD, electroplating, or other suitable method.

Figure 18B:
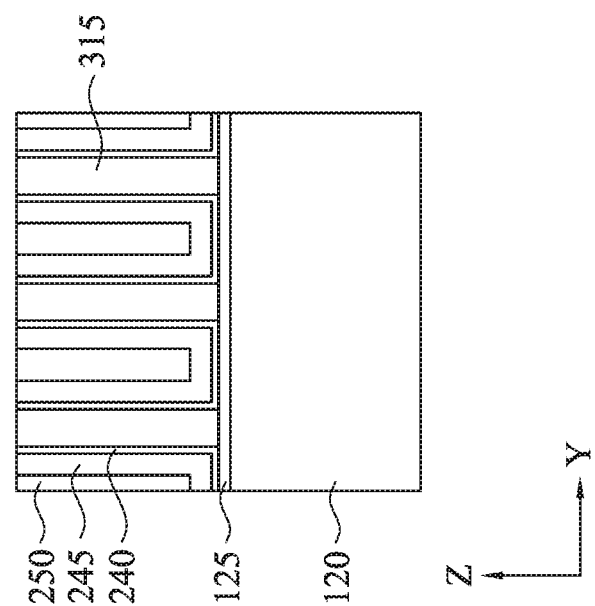
FIG. 18A shows a perspective view and FIG. 18B is a cross sectional view of one of the various stages of a sequential manufacturing operation of memory cell portion of the semiconductor IC according to an embodiment of the present disclosure.
Figure 18A:
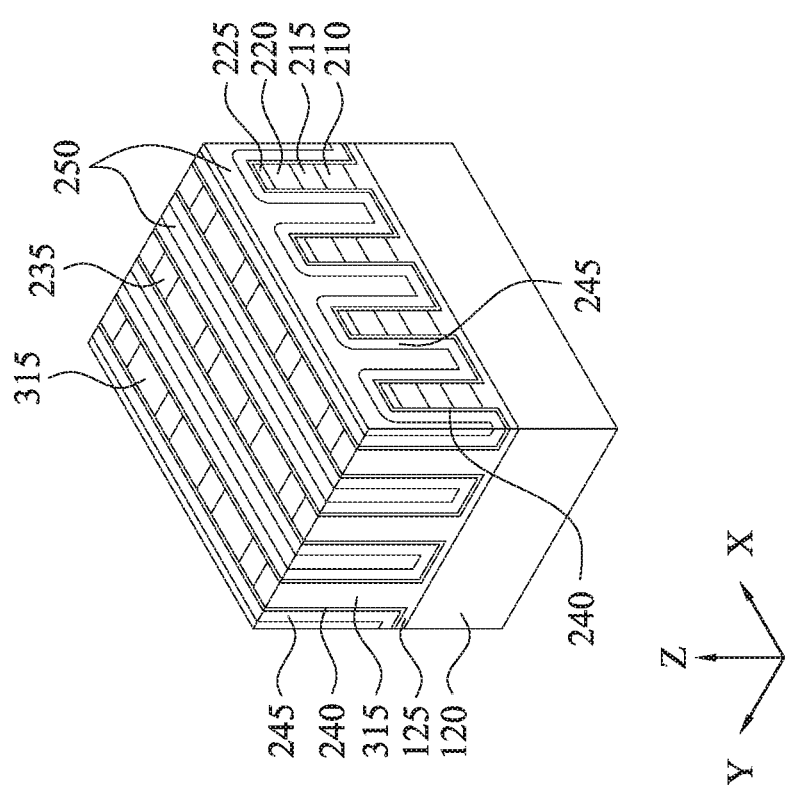

FIG. 18A shows a perspective view and FIG. 18B shows a cross sectional view of one of the various stages of a sequential manufacturing operation of the memory layers 200 of the semiconductor IC according to an embodiment of the present disclosure.

A planarization operation, such as CMP, is subsequently performed on the third conductive layer to expose the upper surface of the separation wall patterns 315, as shown in FIGS. 18A and 18B. The remaining portions of the third conductive layer 251 are word line patterns 250.

Figure 19B:
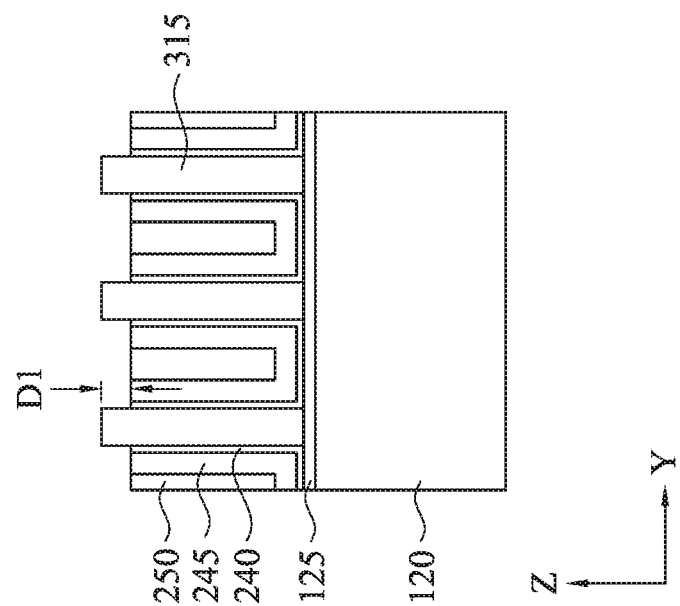
FIG. 19A shows a perspective view and FIG. 19B is a cross sectional view of one of the various stages of a sequential manufacturing operation of memory cell portion of the semiconductor IC according to an embodiment of the present disclosure.
Figure 19A:
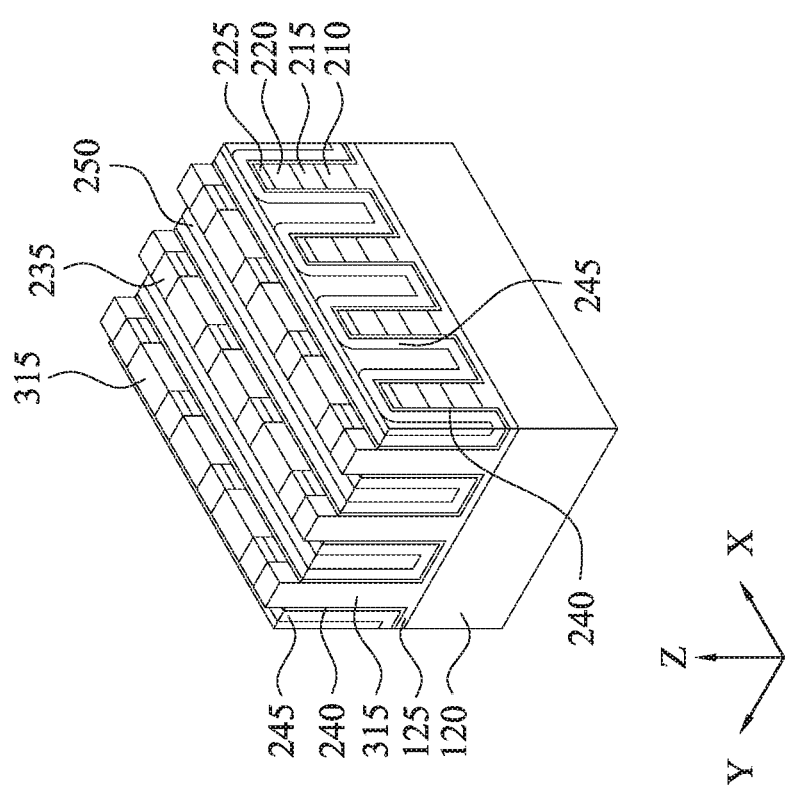

FIG. 19A shows a perspective view and FIG. 19B shows a cross sectional view of one of the various stages of a sequential manufacturing operation of the memory layers 200 of the semiconductor IC according to an embodiment of the present disclosure.

In some embodiments, the top of the word line patterns 250, the selector material layer 245 and the memory layer 240 are recessed by etching as shown in FIGS. 19A and 19B. In some embodiments, one or more etching operations are performed to selectively etch part of the word line patterns 250, the selector material layer 245 and the memory layer 240 against the separation wall patterns 315. The amount of the recess D1 is in a range from about 5 nm to about 30 nm in some embodiments.

Figure 20B:
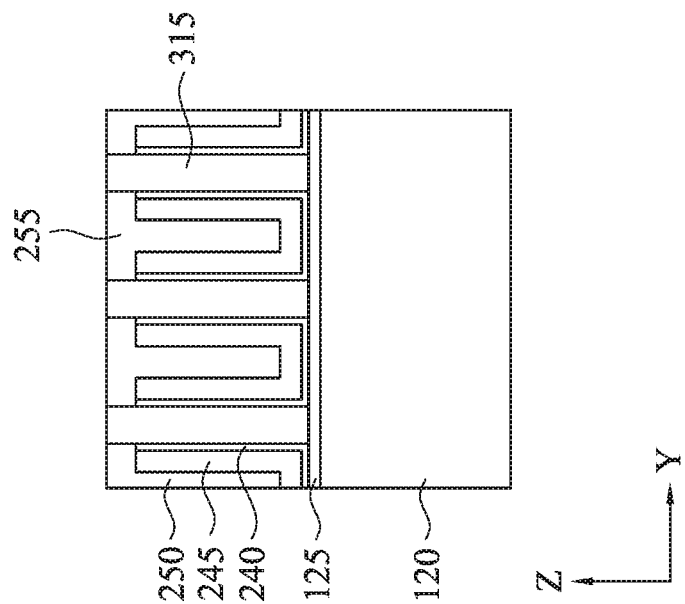
FIG. 20A shows a perspective view and FIG. 20B is a cross sectional view of one of the various stages of a sequential manufacturing operation of memory cell portion of the semiconductor IC according to an embodiment of the present disclosure.
Figure 20A:
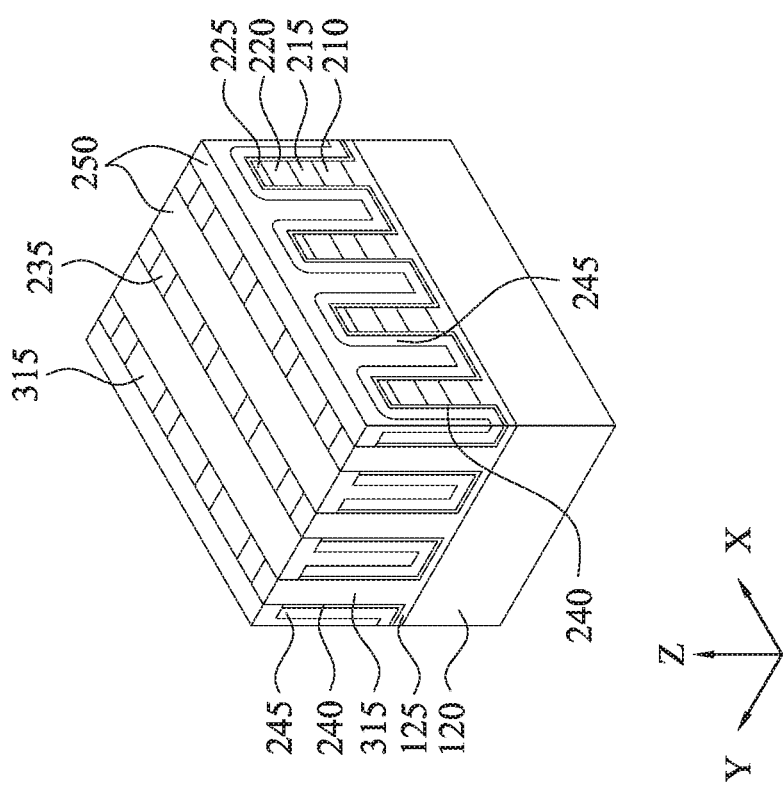

FIG. 20A shows a perspective view and FIG. 20B shows a cross sectional view of one of the various stages of a sequential manufacturing operation of the memory layers 200 of the semiconductor IC according to an embodiment of the present disclosure.

An additional conductive layer 255 is then formed in the recess to form T-shape word lines (250+255). In some embodiments, the additional conductive layer 255 is made of the same material as the third conductive layer 251 (the word line patterns 250).

Figure 21:
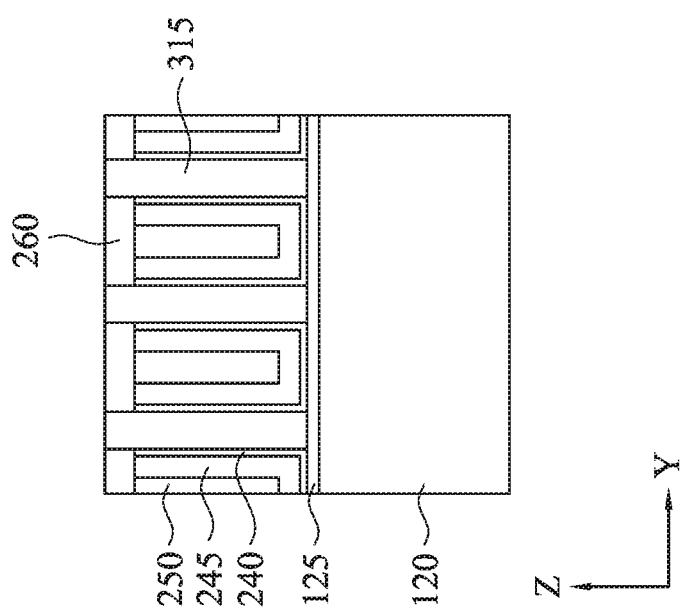
FIG. 21 shows a cross-sectional views of one of the various stages of a sequential manufacturing operation of memory cell portion of the semiconductor IC according to another embodiment of the present disclosure.

In some embodiments, as shown in FIG. 21, the additional conductive layer 260 is made of a different material than the third conductive layer 251 (the word line patterns 250). In some embodiments, the additional conductive layer 260 is made of one or more of Cu, Al, Ni, Co, an alloy thereof, silicide or any other conductive material having a lower resistivity than W.

Figure 22:
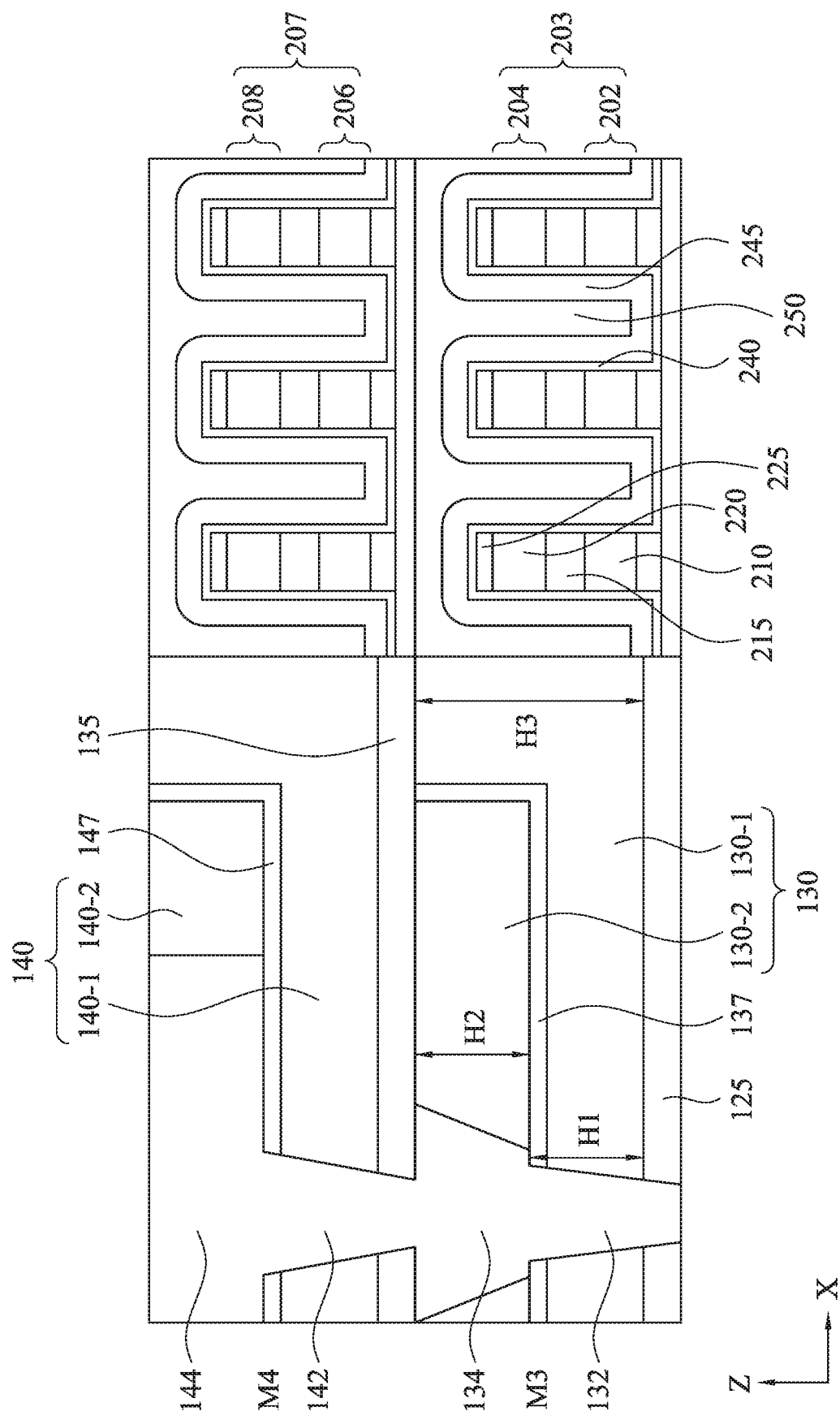
FIG. 22 shows a cross sectional view of a semiconductor integrated circuit (IC) including logic circuit and memory cells according to an embodiment of the present disclosure.

FIG. 22 shows a cross sectional view of M3 and M4 wiring layers of a semiconductor IC including logic circuit and memory cells according to an embodiment of the present disclosure.

As shown in FIG. 22, the memory arrays 203 are disposed in the M3 wiring layer and the memory arrays 207 are disposed in the M4 wiring layer. The memory arrays 203 include a first memory arrays 202 including first bit lines 210 formed by the first conductive layer and second memory arrays 204 including second bit lines 220 formed by the second conductive layer. The word line 250 is commonly provided to the first memory arrays 202 and the second memory arrays 204.

In some embodiments, the height H1 of the third via 132 is substantially equal to the height H2 of the third wiring 134. The difference between H1 and H2 is less than about 2 nm in some embodiments. The height H3 of the memory arrays 203, which is equal to the height of the separation wall is substantially equal to H1+H2. The difference between H3 and H1+H2 is less than about 2 nm in some embodiments. In some embodiments, H1 and H2 are in a range from about 20 nm to about 120 nm, and in other embodiments, H1 and H2 are in a range from about 40 nm to about 90 nm. In some embodiments, H3 is in a range from about 40 nm to about 240 nm, and in other embodiments, H3 is in a range from about 80 nm to about 180 nm. The memory arrays 207 have the same as or a similar structure to the first memory arrays 203.

In some embodiments, the wiring layer M3 includes a lower third ILD layer 130-1 and an upper third ILD layer 130-2. In some embodiments, after the memory arrays 203 are formed (see, FIG. 6), the lower third ILD layer 130-1 is formed, and an intermediate etch stop layer 137 is formed on the lower third ILD layer 130-1. Then, the third via 132 is formed. Thereafter, the upper third ILD layer 130-2 is formed, and the third wiring 134 is formed.

Similarly, in some embodiments, the wiring layer M4 includes a lower fourth ILD layer 140-1 and an upper fourth ILD layer 140-2. In some embodiments, after the memory arrays 207 is formed, the lower fourth ILD layer 140-1 is formed, and an intermediate etch stop layer 147 is formed on the lower fourth ILD layer 140-1. Then, the fourth via 142 is formed. Thereafter, the upper fourth ILD layer 140-2 is formed, and the fourth wiring 144 is formed.

Figure 23:
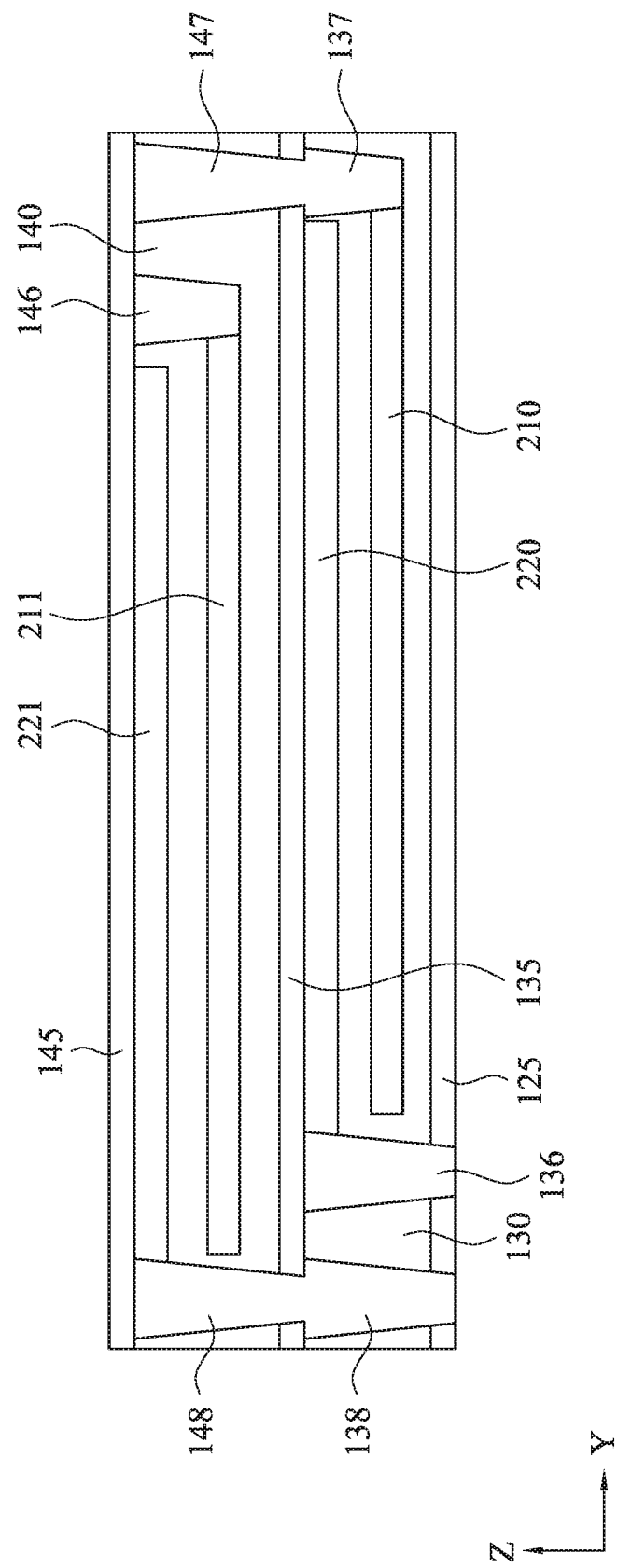
FIG. 23 shows a cross sectional view of a semiconductor integrated circuit (IC) according to an embodiment of the present disclosure.
Figure 24:
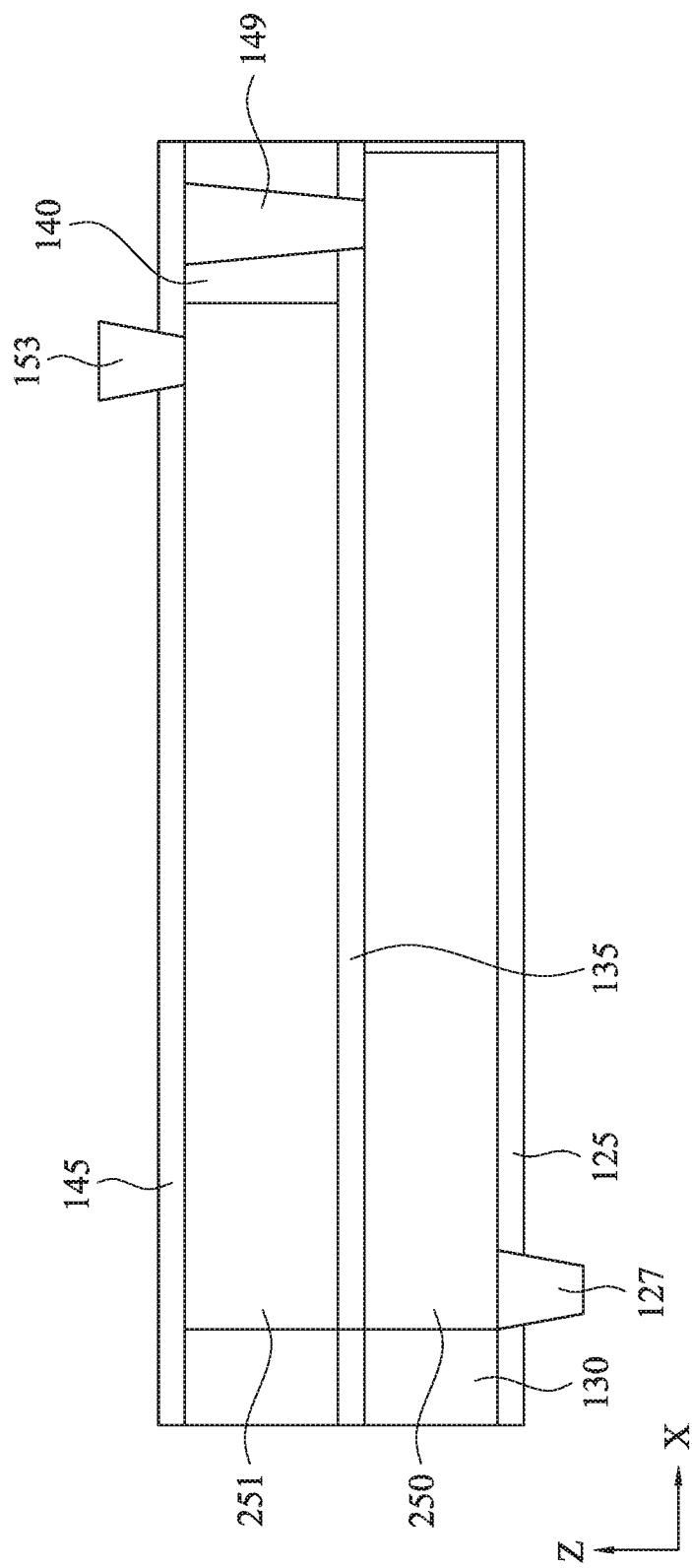
FIG. 24 shows a cross sectional view of a semiconductor integrated circuit (IC) according to an embodiment of the present disclosure.

FIG. 23 shows a cross sectional view along the Y direction and FIG. 24 is a cross sectional view along the X direction cutting a word line of a semiconductor IC including logic circuit and memory cells according to an embodiment of the present disclosure.

In the third wiring layer M3, the memory arrays include first bit lines 210 and second bit lines 220, and in the fourth wiring layer M4, the memory arrays include third bit lines 211 and fourth bit lines 221. In some embodiments, the first bit line 210 is coupled to the upper layer (e.g., M5 or higher) by vias 137 and 147, and the third bit line 211 is coupled to the upper layer (e.g., M5 or higher) by a via 146. In some embodiments, the second bit lines 220 are coupled to the lower layer (e.g., M2 or lower) by a via 136, and the fourth bit lines 221 are coupled to the lower layer (e.g., M2 or lower) by vias 146 and 138.

Further, in some embodiments, the word line 250 in the M3 layer is coupled to the lower layer (e.g., M2 or lower) by a via 127 and to the upper layer (e.g., M5 or higher) by a via 149. In some embodiments, the word line 251 in the M4 layer is coupled to the upper layer (e.g., M5 or higher) by a via 153.

Figure 25:
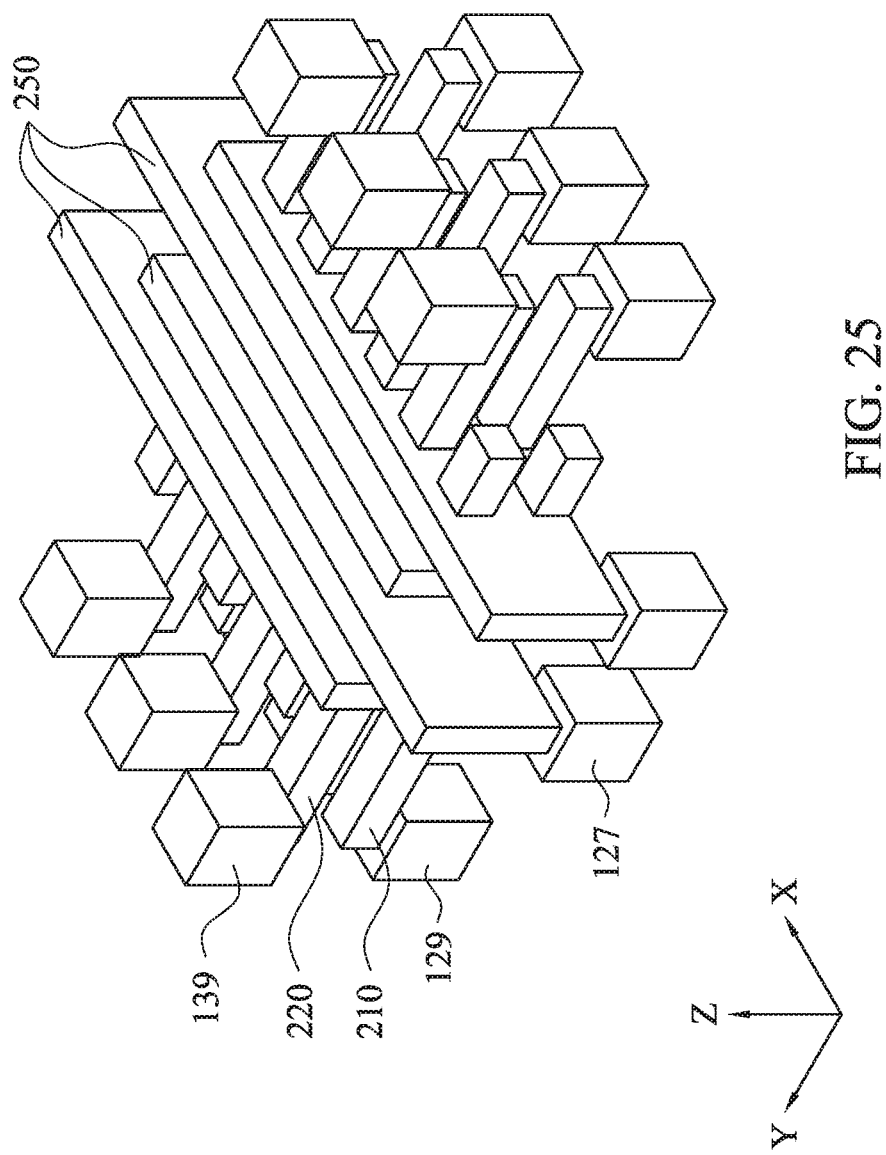
FIG. 25 shows a perspective view of a semiconductor integrated circuit (IC) according to an embodiment of the present disclosure.

FIG. 25 shows a perspective view of a semiconductor IC according to an embodiment of the present disclosure.

The word lines 250 extend in the X direction and bit lines 210 and 220 extend in the Y direction. The ends of the word lines 250 are coupled to the lower wiring layer by a via 127 or the upper wiring layer in some embodiments. The ends of the first bit lines 210 are coupled to the lower wiring layer by a via 129 or the upper wiring layer. The ends of the second bit lines 220 are coupled to the lower wiring layer or the upper wiring layer by a via 139. The vias are provided to every other word lines and/or the bit lines at ends, and other vias are provided to every other word lines and/or the bit lines at other ends.

In the foregoing embodiments, the memory arrays are disposed on the third and fourth wiring layers. However, the locations of the memory arrays are not limited to M3 and M4 wiring layers. In some embodiments, the fifth wiring layer M5 also includes the memory arrays same as or similar to the memory arrays 203 and 207 at a location 209 shown in FIG. 1A. In some embodiments, the memory arrays are located in the fourth and fifth wiring layers. In other embodiments, the memory arrays are located in the fourth, fifth and sixth wiring layers. In some embodiments, the memory arrays are located in the second and third wiring layers. In other embodiments, the memory arrays are located in the second, third and fourth wiring layers.

In the present disclosure, high density memory arrays embedded in metal/ILD layers over logic circuitry are provided. The memory cells of the memory arrays include stacked layers, including metal pads. The metal pad serves a barrier or to provide a uniform electric field in the memory. The memory cell also includes a selector material layer and a memory layer. The memory cells include RRAM, PCRAM, FRAM, MRAM and/or NRAM or any types of memory compatible with nano-scale logic circuits. The horizontal array with nano-wires (bit lines) and orthogonal metal slices (word lines) is fabricated in the BEOL of the logic circuit. The peripheral circuits and PnR (placement and routing) for the memory array can be integrated into FEOL/BEOL of the logic circuit.

Since the memory arrays are located in the BEOL (M3 to M4), the area under the arrays can be utilized by the designer as regions of logic cells, I/O, ESD and/or peripheral circuits for the memory arrays. With the configuration of the present disclosure, performance enhancement and high flexibility for the circuit design, ease for the integration with logic circuits and lowered cost due to lower area consumption on the chip can be achieved.

It will be understood that not all advantages have been necessarily discussed herein, no particular advantage is required for all embodiments or examples, and other embodiments or examples may offer different advantages.

According to one aspect of the present disclosure, a semiconductor device includes logic circuitry including a transistor disposed over a substrate, multiple layers each including metal wiring layers and an interlayer dielectric layer, respectively disposed over the logic circuitry, and memory arrays. The multiple layers of metal wiring include, in order closer to the substrate, first, second, third and fourth layers, and the memory arrays include lower multiple layers disposed in the third layer. In one or more of the foregoing and following embodiments, the memory arrays include upper multiple layers disposed in the fourth layer. In one or more of the foregoing and following embodiments, each of the lower multiple layers and the upper multiple layers of the memory arrays includes two memory layers. In one or more of the foregoing and following embodiments, the two memory layers include two layers of bit lines vertically stacked and word lines crossing the two layers of bit lines. In one or more of the foregoing and following embodiments, peripheral circuits to operate the memory arrays are disposed below the memory arrays. In one or more of the foregoing and following embodiments, part of the logic circuitry is disposed below the memory arrays. In one or more of the foregoing and following embodiments, the memory arrays include phase change memory cells. In one or more of the foregoing and following embodiments, each of the phase change memory cells includes a phase change memory layer made of one or more selected from the group consisting of Ge, Ga, Sn and In, and one or more selected from the group consisting of Sb and Te. In one or more of the foregoing and following embodiments, the phase change memory layer further includes one or more selected from the group consisting of nitrogen, bismuth and silicon oxide. In one or more of the foregoing and following embodiments, each of the phase change memory cells includes a selector material layer made of one or more selected from the group consisting of AsGeSe doped with one or more selected from the group consisting of N, P, S, Si and Te; and AsGeSeSi doped with one or more selected from the group consisting of N, P, S, Si and Te. In one or more of the foregoing and following embodiments, the memory arrays include resistivity change memory cells. In one or more of the foregoing and following embodiments, each of the resistivity change memory cells includes a phase change memory layer made of one or more selected from the group consisting of $HfO_x$, $TiO_x$, $TaO_x$, $ZrO_x$, $WO_x$, $AlO_x$, $NbO_x$, $FeO_x$, $GeO_x$, $GdO_x$, NiO, CeO, NiO, ZrO and CuO. In one or more of the foregoing and following embodiments, the memory arrays include magnetic memory cells. In one or more of the foregoing and following embodiments, the memory arrays include ferroelectric memory cells. In one or more of the foregoing and following embodiments, the multiple layers of metal wiring include, in order closer to the fourth layer, fifth, sixth and seventh layers above the fourth layer.

In accordance with another aspect of the present disclosure, a semiconductor device includes logic circuitry including transistors disposed over a substrate, multiple layers each including metal wiring layers and an interlayer dielectric layer, respectively, disposed over the logic circuitry, and memory arrays disposed in at least one of the multiple layers. Peripheral circuitry for the memory arrays is disposed below the memory arrays. In one or more of the foregoing and following embodiments, in plan view, an area of the peripheral circuitry is less than 10% of an area of the memory cell arrays. In one or more of the foregoing and following embodiments, a height of the memory cell array disposed in the at least one of the multiple layers is substantially equal to a height of the at least one of the multiple layers. In one or more of the foregoing and following embodiments, the memory arrays include two layers of bit lines vertically stacked and word lines crossing the two layers of bit lines.

In accordance with another aspect of the present disclosure, a semiconductor device includes logic circuitry including transistors disposed over a substrate, multiple layers each including metal wiring layers and an interlayer dielectric layer, respectively, and memory arrays disposed in at least one of the multiple layers. The memory arrays include two layers of bit lines vertically stacked and word lines crossing the two layers of bit lines, and the memory arrays include a memory layer and a selector material layer, which are disposed between the two layers of bit lines and the word lines.

In accordance with one aspect of the present disclosure, in a method of manufacturing a semiconductor device, logic circuitry including transistors is formed over a substrate, and first and second wiring layers are formed over the transistors. Each of the first and second wiring layers includes metal wirings and an interlayer dielectric layer. A first memory array layer is formed over the second wiring layer, a third wiring layer is formed, a second memory array layer is formed over the first memory array layer, and a fourth wiring layer is formed. The first memory array layer is disposed at a same layer as the third wiring layer, and the second memory array layer is disclosed at a same layer as the fourth wiring layer. In one or more of the foregoing and following embodiments, the semiconductor device includes a logic circuit region and a memory region in plan view, and in the forming the first memory array layer, a first blanket memory layer is formed over the logic circuit region and the memory region, and the first blanket memory layer on the logic circuit region is removed. In one or more of the foregoing and following embodiments, after the first memory array layer is formed, wiring structures of the third wiring layer are formed. In one or more of the foregoing and following embodiments, in the forming the second memory array layer, a second blanket memory layer is formed over the logic circuit region and the memory region, and the second blanket memory layer on the logic circuit region is removed. In one or more of the foregoing and following embodiments, after the second memory array layer is formed, wiring structures of the fourth wiring layer are formed. In one or more of the foregoing and following embodiments, a fifth wiring layer is formed over the fourth wiring layer and the second memory array layer. In one or more of the foregoing and following embodiments, the first memory array layer is formed by the following operation. A film stack is formed over the second wiring layer. The film stack includes a first conductive layer, a first insulating layer, a second conductive layer, a second insulating layer, a third insulating layer and a fourth insulating layer stacked in this order. The film stack is patterned to from bit-line patterns extending in a first direction, separation wall patterns extending in a second direction crossing the first direction are formed over the bit-line patterns, a memory layer is formed over the bit-line patterns and the separation wall patterns, and word line patterns extending in the second direction are formed. In one or more of the foregoing and following embodiments, the operation further comprises, between the forming the memory layer and the forming the word line patterns, forming a selector material layer. In one or more of the foregoing and following embodiments, the second insulating layer is made of a material other than silicon based insulating material. In one or more of the foregoing and following embodiments, the first, third and fourth insulating layers are made of a silicon based insulating material. In one or more of the foregoing and following embodiments, after the separation wall patterns are formed, an upper surface of the second insulating layer is exposed. In one or more of the foregoing and following embodiments, the separation wall patterns includes a body insulating layer and part of the third and fourth insulating layers. In one or more of the foregoing and following embodiments, a first etch stop layer is formed over the second wiring layer before the first memory array layer is formed. In one or more of the foregoing and following embodiments, after the first memory array layer is formed, a thickness of the first etch stop layer is partially reduced.

In accordance with another aspect of the present disclosure, in a method of manufacturing a semiconductor device including memory arrays, an etch stop layer is formed over a lower metal wiring layer. A memory array includes a stacked structure including a first conductive layer over the etch stop layer, a first insulating layer over the first conductive layer, a second conductive layer over the first insulating layer, a second insulating layer over the second conductive layer, a third insulating layer over the second insulating layer, and a fourth insulating layer over the third insulating layer. Bit-line patterns are formed by patterning the stacked structure, a dielectric layer is formed over the bit-line patterns, the dielectric layer is formed, thereby forming wall patterns crossing the bit-line patterns, a memory layer is formed, word line patterns are formed by forming a third conductive layer filling spaces between the bit-line patterns and the wall patterns, a part of the memory array layer is removed, and a metal wiring layer is formed over the lower metal wiring layer. In one or more of the foregoing and following embodiments, a selector material layer is formed on the memory layer. In one or more of the foregoing and following embodiments, the memory layer includes a phase change material or a resistivity change material. In one or more of the foregoing and following embodiments, the second insulating layer is made of aluminum oxide and the first, third and fourth insulating layer is made of silicon oxide or silicon nitride. In one or more of the foregoing and following embodiments, the first and second conductive layers are made of tungsten.

In accordance with another aspect of the present disclosure, in a method of manufacturing a semiconductor device including memory arrays, an etch stop layer is formed over a lower metal wiring layer, a memory array layer is formed. The memory array layer includes a stacked structure including a first conductive layer over the etch stop layer, a first insulating layer over the first conductive layer, a second conductive layer over the first insulating layer, a second insulating layer over the second conductive layer, a third insulating layer over the second insulating layer, and a fourth insulating layer over the third insulating layer. Bit-line patterns are formed by patterning the stacked structure, a dielectric layer is formed over the bit-line patterns, the dielectric layer is patterned, thereby forming wall patterns crossing the bit-line patterns, a memory layer is formed, a selector material layer is formed, a third conductive layer is formed filling spaces between the bit-line patterns and the wall patterns, recesses are formed along the wall patterns, word line patterns are formed by filling the recesses with a fourth conductive layer, a part of the memory array layer is removed, and a metal wiring layer is formed over the lower metal wiring layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming logic circuitry including transistors over a substrate;
    forming first and second wiring layers over the transistors, each of the first and second wiring layers including metal wirings and an interlayer dielectric layer;
    forming a first memory array layer over the second wiring layer;
    forming a third wiring layer;
    forming a second memory array layer over the first memory array layer; and
    forming a fourth wiring layer, wherein:
    the first memory array layer is disposed at a same layer as the third wiring layer, and the second memory array layer is disposed at a same layer as the fourth wiring layer,
    the semiconductor device includes a logic circuit region and a memory region in plan view, and
    in the forming the first memory array layer, a first blanket memory layer including a plurality of first word lines and first bit lines is formed over the logic circuit region and the memory region, and a part of the first blanket memory layer on the logic circuit region is removed, wherein a part of the plurality of first word lines and first bit lines included in the part of the first blanket memory layer is removed when removing the part of the first blanket memory layer.

2. The method of claim 1, wherein after the first memory array layer is formed, wiring structures of the third wiring layer are formed.

3. The method of claim 1, wherein:
    in the forming the second memory array layer, a second blanket memory layer including a plurality of second word lines and bit lines is formed over the logic circuit region and the memory region, and a part of the second blanket memory layer on the logic circuit region is removed, wherein a part of the plurality of second word lines and second bit lines included in the part of the second blanket memory layer is removed when removing the part of the second blanket memory layer.

4. The method of claim 3, wherein after the second memory array layer is formed, wiring structures of the fourth wiring layer are formed.

5. The method of claim 1, further comprising forming a fifth wiring layer over the fourth wiring layer and the second memory array layer.

6. The method of claim 1, wherein the first memory array layer including the plurality of first memory cell structures is formed by an operation comprising:
    forming a film stack over the second wiring layer, the film stack including a first conductive layer, a first insulating layer, a second conductive layer, a second insulating layer, a third insulating layer and a fourth insulating layer stacked in this order;
    patterning the film stack to from bit-line patterns extending in a first direction;
    forming separation wall patterns extending in a second direction crossing the first direction over the bit-line patterns;
    forming a memory layer over the bit-line patterns and the separation wall patterns; and
    forming word line patterns extending in the second direction.

7. The method of claim 6, wherein the operation further comprises, between the forming the memory layer and the forming the word line patterns, forming a selector material layer is removed when removing the part of the second blanket memory layer.

8. The method of claim 6, wherein the second insulating layer is made of a material other than silicon based insulating material.

9. The method of claim 8, wherein the first, third and fourth insulating layers are made of a silicon based insulating material.

10. The method of claim 6, wherein after the separation wall patterns are formed, an upper surface of the second insulating layer is exposed.

11. The method of claim 10, wherein the separation wall patterns includes a body insulating layer and part of the third and fourth insulating layers.

12. The method of claim 1, further comprising forming a first etch stop layer over the second wiring layer before the first memory array layer is formed.

13. The method of claim 12, wherein after the first memory array layer is formed, a thickness of the first etch stop layer is partially reduced.

14. A method of manufacturing a semiconductor device including memory arrays, the method comprising:
   forming an etch stop layer over a lower metal wiring layer;
   forming a memory array layer including:
      forming a stacked structure including a first conductive layer over the etch stop layer, a first insulating layer over the first conductive layer, a second conductive layer over the first insulating layer, a second insulating layer over the second conductive layer, a third insulating layer over the second insulating layer, and a fourth insulating layer over the third insulating layer;
      forming bit-line patterns by patterning the stacked structure;
      forming a dielectric layer over the bit-line patterns;
      patterning the dielectric layer, thereby forming wall patterns crossing the bit-line patterns;
      forming a memory layer; and
      forming word line patterns by forming a third conductive layer filling spaces between the bit-line patterns and the wall patterns;
   removing a part of the memory array layer; and
   forming a metal wiring layer over the lower metal wiring layer.

15. The method of claim 14, further comprising forming a selector material layer on the memory layer.

16. The method of claim 14, wherein the memory layer includes a phase change material or a resistivity change material.

17. The method of claim 14, wherein the second insulating layer is made of aluminum oxide and the first, third and fourth insulating layer is made of silicon oxide or silicon nitride.

18. The method of claim 14, wherein the first and second conductive layers are made of tungsten.

19. A method of manufacturing a semiconductor device including memory arrays, the method comprising:
   forming an etch stop layer over a lower metal wiring layer;
   forming a memory array layer including:
      forming a stacked structure including a first conductive layer over the etch stop layer, a first insulating layer over the first conductive layer, a second conductive layer over the first insulating layer, a second insulating layer over the second conductive layer, a third insulating layer over the second insulating layer, and a fourth insulating layer over the third insulating layer;
      forming bit-line patterns by patterning the stacked structure;
      forming a dielectric layer over the bit-line patterns;
      patterning the dielectric layer, thereby forming wall patterns crossing the bit-line patterns;
      forming a memory layer;
      forming a selector material layer;
      forming a third conductive layer filling spaces between the bit-line patterns and the wall patterns;
      forming recesses along the wall patterns; and
      forming word line patterns by filling the recesses with a fourth conductive layer;
   removing a part of the memory array layer; and
   forming a metal wiring layer over the lower metal wiring layer.

20. The method of claim 19, wherein the memory layer includes a phase change material or a resistivity change material.

* * * * *